US012610513B2

(12) United States Patent
Sung et al.

(10) Patent No.: US 12,610,513 B2
(45) Date of Patent: Apr. 21, 2026

(54) SRAM WITH IMPROVED PROGRAM AND SENSING MARGIN FOR SCALED NANOSHEET DEVICES

(71) Applicant: International Business Machines Corporation, Armonk, NY (US)

(72) Inventors: Min Gyu Sung, Latham, NY (US); Ruilong Xie, Niskayuna, NY (US); Heng Wu, Santa Clara, CA (US); Julien Frougier, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 684 days.

(21) Appl. No.: 17/949,579

(22) Filed: Sep. 21, 2022

(65) Prior Publication Data

US 2024/0098961 A1     Mar. 21, 2024

(51) Int. Cl.
*H10B 10/00* (2023.01)
(52) U.S. Cl.
CPC .................................. *H10B 10/125* (2023.02)
(58) Field of Classification Search
CPC .................................................... H10B 10/125
See application file for complete search history.

(56) References Cited

U.S. PATENT DOCUMENTS

| | | |
|---|---|---|
| 9,484,457 B2 | 11/2016 | Baars et al. |
| 10,170,484 B1 | 1/2019 | Sung et al. |
| 10,741,639 B2 | 8/2020 | Loubet et al. |
| 10,833,078 B2 | 11/2020 | Smith et al. |
| 10,977,409 B1 * | 4/2021 | Chang .................... G06F 30/392 |
| 11,062,937 B2 | 7/2021 | Cheng et al. |
| 11,309,319 B2 * | 4/2022 | Mann ..................... H10D 30/62 |

(Continued)

FOREIGN PATENT DOCUMENTS

| | | |
|---|---|---|
| EP | 3340300 A1 | 6/2018 |
| KR | 10-2021-0078388 A | 6/2021 |
| KR | 10-2325870 B1 | 11/2021 |

OTHER PUBLICATIONS

Jan et al. "A 22nm Soc Platform Technology Featuring 3-D Tri-Gate and High-K/Metal Gate, Optimized for Ultra Low Power, High Performance and High Density Soc Applications", 2012 International Electron Devices Meeting, Dec. 10-13, 2012, 4 pages, DOI: 10.1109/IEDM.2012.6478969.

(Continued)

*Primary Examiner* — Steven M Page
(74) *Attorney, Agent, or Firm* — Samuel A. Waldbaum

(57) ABSTRACT

An integrated circuit structure includes a memory cell and multiple transistors therein. The multiple transistors are formed using channels including a stack having alternating layers of conductive semiconductor material and layers of other material that are insulative. Two or more of the multiple transistors have a same number of layers of the conductive semiconductor material in corresponding channel regions but have different numbers of active layers and inactive layers of the conductive semiconductor material. An active layer is a layer forming a channel in the channel region that is electrically coupled to S/D regions in a corresponding transistor, while a floating layer is a layer in the channel region electrically isolated from the S/D regions in the corresponding transistor. Methods for forming the integrated circuit structure are disclosed.

20 Claims, 37 Drawing Sheets

(56) References Cited

U.S. PATENT DOCUMENTS

| | | | |
|---|---|---|---|
| 2020/0105868 A1* | 4/2020 | Loubet | .................. B82Y 10/00 |
| 2020/0105869 A1* | 4/2020 | Loubet | ................ H10D 62/151 |
| 2020/0287046 A1* | 9/2020 | Frougier | ........... H10D 84/0142 |
| 2021/0322909 A1 | 10/2021 | Liu et al. | |
| 2022/0108983 A1 | 4/2022 | Bao et al. | |

OTHER PUBLICATIONS

Lee et al. "Monolithic 3D 6T-SRAM Based on Newly Designed Gate and Source/Drain Bottom Contact Schemes", IEEE, Oct. 4, 2021, pp. 138192-138199.
Studocu. "Lecture 9: Strain Analysis in Daily Life—EE 290D Fall 2013", Advanced Topics in Electrical Engineering: Advanced Topics in Semiconductor Technology (EE 290D), 2013, 4 pages.

* cited by examiner

C_cut

C_cut

C_cut

C_cut

C_cut

C_cut

C_cut

C_cut

1310

420

310          310

310

310

320          320

200

Si 320          210

B 460-1

C

A 460-2

460-3

260-1   260-2   260-3

SRAM WITH IMPROVED PROGRAM AND SENSING MARGIN FOR SCALED NANOSHEET DEVICES

BACKGROUND

This invention generally relates to semiconductors and, more specifically, relates to SRAM (static random-access memory) sensing with improved program margin for scaled nanosheet device.

For SRAM, there is a requirement of a largest reading and writing margin. That is, high bitlines should not overpower inverters during reads. On the other hand, low bitlines must write a new value into a cell. There is room for improvement for semiconductor structures and method of manufacturing for SRAM and other circuit technologies.

One attempt at improvement is through U.S. Pat. No. 10,170,484. This attempts to create transistors using different amounts of semiconductor material in different fins for different transistors to create different drive currents: "Transistors (e.g., GAAFETs) can subsequently be formed using these multi-layer fins. The GAAFETs can include: a first transistor, which has multiple first channel regions formed using multiple layers of the first semiconductor material in the first fin; a second transistor, which includes at least two second channel region formed using the at least two layer of the first semiconductor material in the second fin; and a third transistor, which includes at least one channel region formed using the at least one layer of the first semiconductor material in the third fin. Since the third transistor has fewer channel regions than the second transistor and the second transistor has fewer channel regions than the first transistor, these three transistors will have different drive currents. That is, the first transistor will have a higher drive current than the second transistor and the second transistor will have a higher drive current than the third transistor."

SUMMARY

This section is meant to be exemplary and not meant to be limiting.

An exemplary embodiment is an integrated circuit structure, which comprises a memory cell, and multiple transistors forming at least part of the memory cell. The multiple transistors are formed using channels comprising a stack, the stack comprising alternating layers of conductive semiconductor material and layers of other material that are insulative. Two or more of the multiple transistors have a same number of layers of the conductive semiconductor material in corresponding channel regions but have different numbers of active layers and inactive layers of the conductive semiconductor material. An active layer is a layer of the conductive semiconductor material forming a channel in the channel region that is electrically coupled to source and drain regions in a corresponding transistor, while a floating layer is a layer of the conductive semiconductor material in the channel region electrically isolated from the source and drain regions in the corresponding transistor. This has at least an advantage of providing the ability for multiple transistors in the memory cell to have different relative strengths.

Another example is an integrated circuit structure according to the last paragraph, where the integrated circuit structure comprises a substrate, and the memory cell is formed on the substrate. The multiple transistors comprise a first transistor comprising a first source region on the substrate, a first drain region on the substrate, a first channel region extending laterally between the first source region and the first drain region, and a gate wrapping around at least part of the channel region. The first transistor has at least one floating layer formed because the corresponding at least one layer of conductive semiconductor material has an insulator on first and second lateral surfaces of the at least one layer, the insulator electrically isolating the at least one floating layer from material that abuts the isolator. This has an exemplary advantage of providing one possible relative strength, e.g., a "medium" strength.

Another example is the integrated circuit structure according to the previous paragraph wherein the multiple transistors comprise a second transistor comprising a second source region on the substrate, a second drain region on the substrate, a second channel region extending laterally between the second source region and the second drain region, and a gate wrapping around at least part of the second channel region. In this example, all of the sheets of semiconductor material in the second channel region electrically couple to the second source region and second drain region. This has an exemplary advantage of providing one possible relative strength, e.g., a "strong" strength.

A further example includes an integrated circuit structure according to the previous paragraph, wherein the at least one floating sheet of the first transistor is a single floating sheet. The multiple transistors comprise a third transistor comprising a third source region on the substrate, a third drain region on the substrate, a third channel region extending laterally between the third source region and the third drain region, and a gate wrapping around at least part of the third channel region. The third transistor has multiple floating sheets formed because corresponding multiple layers of conductive semiconductor material have an insulator on first and second lateral surfaces of the multiple layers of semiconductor material, the insulator electrically isolating the at least one floating layer from material that abuts the isolator. This has an advantage of providing yet another relative strength, e.g., a "weak" strength.

Yet another example is an integrated circuit structure according to the previous paragraph, wherein the memory cell comprises a static random access memory cell, wherein the first transistor is an N-type pass-gate transistor, the second transistor is a P-type pull up transistor, and the third transistor is an N-type pull down transistor. This has an advantage of providing a static random access memory cell.

Another example is a method that comprises forming a memory cell on a substrate, and forming multiple transistors that form at least part of the memory cell. The forming the multiple transistors comprise the following:

forming and patterning a stack, the stack comprising alternating layers of conductive semiconductor material and layers of other material that are insulative;

forming channel regions comprising the stack; and forming source and drain regions on opposing sides of the channel regions.

Two or more of the multiple transistors have a same number of layers of the conductive semiconductor material in corresponding channel regions but have different numbers of active layers and inactive layers of the conductive semiconductor material. An active layer is a layer of the conductive semiconductor material forming a channel in the channel region that is electrically coupled to source and drain regions in a corresponding transistor, while a floating layer is a layer of the conductive semiconductor material in the channel region electrically isolated from the source and drain regions in the corresponding transistor. This has at least an advantage of forming a structure providing the ability for multiple transistors in the memory cell to have different relative strengths.

A further example is a method according to the previous paragraph, wherein forming the multiple transistors comprises forming a first transistor comprising a first source region formed on the substrate, a first drain region formed on the substrate, a first channel region extending laterally between the first source region and the first drain region. Forming the first transistor comprises: forming a gate wrapping around at least part of the channel region; and prior to forming the first source region and first drain region and while forming the first channel region, forming at least one floating layer comprising performing an optical planarization layer coating and lithography to cover sides of fins comprising the stack, performing an optical planarization layer recess to cover active layers but leave the at least one floating layer uncovered by the optical planarization layer, performing a dent of a layer of the semiconductor material in the at least one floating layer, and forming a spacer deposition of insulator to cover sidewalls of the fins including first and second lateral surfaces of the dented layer. The method includes foliating the first source region and second source region having sides contacting sides of the fins including sides of the active layers. This has an exemplary advantage of providing one possible relative strength, e.g., a "medium" strength.

Another example is a method according to the previous paragraph, wherein forming the multiple transistors comprises forming a second transistor. The second transistor comprises a second source region on the substrate, a second drain region on the substrate, a second channel region extending laterally between the second source region and the second drain region, and a gate wrapping around at least part of the second channel region, wherein all of the sheets of semiconductor material in the second channel region electrically couple to the second source region and second drain region. This has an exemplary advantage of providing one possible relative strength, e.g., a "strong" strength.

A further example is a method according to the previous paragraph, wherein the at least one floating sheet of the first transistor is a single floating sheet, and forming the multiple transistors comprises forming a third transistor comprising a third source region on the substrate, a third drain region on the substrate, and a third channel region extending laterally between the third source region and the third drain region. The forming the third transistor comprises: forming a gate wrapping around at least part of the third channel region; and prior to forming the first source region and third drain region and while forming the third channel region, forming two floating layers comprising performing a first lithographic process comprising an optical planarization layer coating and lithography to cover sides of fins comprising the stack, performing an optical planarization layer recess to cover active layers but leave a first floating layer uncovered by the optical planarization layer, performing a dent of the layer of the semiconductor material in the first floating layer, performing a second lithographic process comprising an optical planarization layer coating and lithography to cover sides of fins comprising the stack, performing an optical planarization layer recess to cover active sheets but leave the first floating layer and a second floating layer uncovered by the optical planarization layer, performing a dent of the layers of the semiconductor material in the first and second floating layers, and forming a spacer deposition of insulator to cover sidewalls of the fins including first and second lateral surfaces the dented sheets. The method also includes forming the third source region and third source region having sides contacting sides of the fins including sides of the active layers. This has an advantage of providing yet another relative strength, e.g., a "weak" strength.

Another example is a method according to the previous paragraph, wherein a lithography is performed with a mask having open areas for the first transistor and second transistor and having closed areas elsewhere to form the single floating layer of the first transistor and the dent of the first floating layer of the third transistor. Additionally, another lithography is performed with a mask having open areas for the second transistor and closed areas elsewhere to form the dent of the first and second floating layers of the third transistor. This has an exemplary advantage of providing different strengths of transistors using a few different lithography steps.

Another example is a method according to the last two paragraphs, wherein the memory cell comprises a static random access memory cell, wherein forming the first transistor forms an N-type pass-gate transistor, wherein forming the second transistor forms a P-type pull up transistor, and wherein forming the third transistor forms an N-type pull down transistor. This has an advantage of providing a static random access memory cell.

BRIEF DESCRIPTION OF THE SEVERAL VIEWS OF THE DRAWINGS

FIGS. 2A to 17D illustrate formation of an integrated circuit structure for SRAM, where:

FIG. 2A illustrates an integrated circuit structure after nanosheet fin patterning and FIG. 2B shows the cut of the structure being shown in FIG. 2A;

FIGS. 17A, 17B, and 17C illustrate the integrated circuit structure for a pull down transistor after contact formation, and FIG. 17D shows the cuts (A, B, and C, respectively) of the structures being shown in FIGS. 17A, 17B, and 17C.

DETAILED DESCRIPTION

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

Figure 1A:
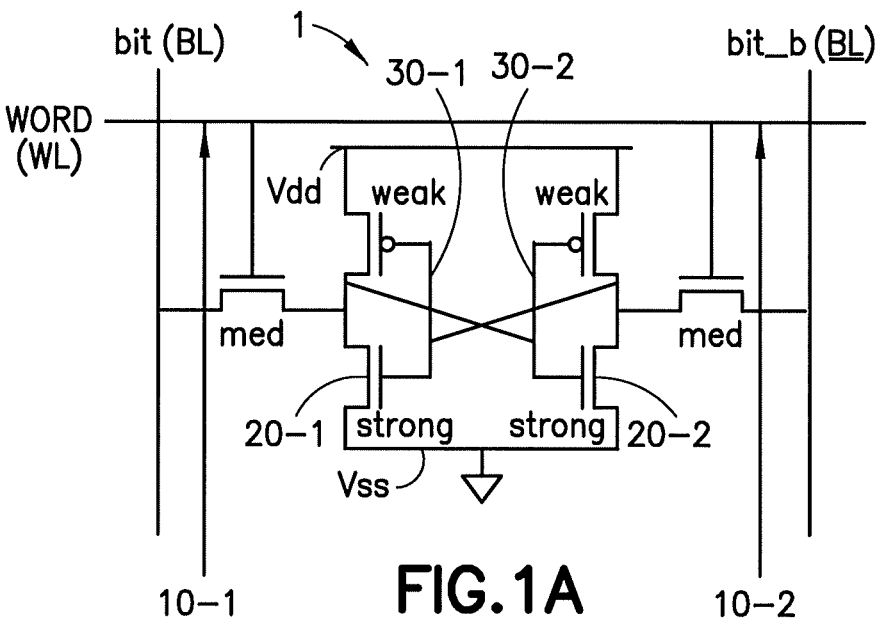
FIG. 1A illustrates an SRAM circuit.

As described above, for SRAM (static random-access memory), there is a requirement of a largest reading and writing margin: high bitlines should not overpower inverters during reads; but low bitlines must write a new value into a cell. FIG. 1A illustrates an SRAM circuit. In this SRAM circuit 1, there is a wordline (WL), a high bitline (bit or BL) and its corresponding low bitline (bit_b or BL), access (also called pass gate transistor) transistors 10-1 and 10-2, pulldown (PD) transistors 20-1 and 20-2, and pullup (PU) transistors 30-1 and 30-2. The "_b" (or BL) indicates a low value relative to a high value on the corresponding line. The "weak", "strong", and "med" (medium) indicate the relative strength of the corresponding transistor, e.g., via drive currents. The weak transistors have a lower drive current than the medium transistors, which have a lower drive current than the strong transistors.

A conventional approach for a FinFET-based SRAM, where Fin-FET is fin-type FETs (field effect transistors), include the following:

A smallest number of fins are on the pullup transistors 30;

A largest number of fins are on the pulldown transistors 20; and

A middle number of fins are on the pass gate (PG) transistors 10.

Using a 22 nm, tri-gate technology for SRAMs, different SRAM families are implemented by using different numbers of PD and PG fins. For instance, a relatively high density and low leakage cell (e.g., 0.092 $\mu m^2$) could use one PG fin and one PD fin, while a relatively low voltage cell (e.g., 0.108 $\mu m^2$) could use one PG fin and two PD fins, and a relatively high-speed cell (e.g., 0.130 $\mu m^2$) could use two PG fins and 3 PD fins. Thus, the number of fins can have a relationship with the desired type of cell. See C.-H. Jan, et al, "A 22 nm SoC Platform Technology Featuring 3-D Tri-Gate and High-k/Metal Gate, Optimized for Ultra Low Power, High Performance and High Density SoC Applications", 2012 International Electron Devices Meeting, 2012, pp. 3.1.1-3.1.4, doi: 10.1109/IEDM.2012.6478969.

Figure 1B:
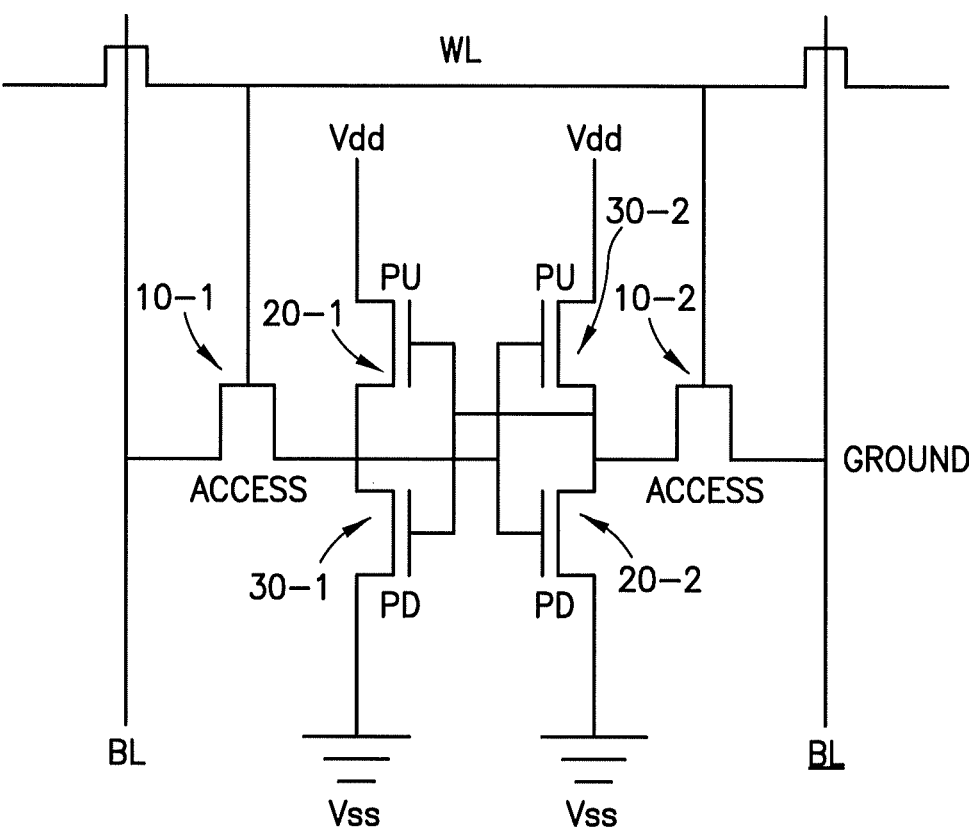
FIG. 1B illustrates a different way of looking at the SRAM circuit of FIG. 1A, and this is also used in FIG. 1C.
Figure 1C:
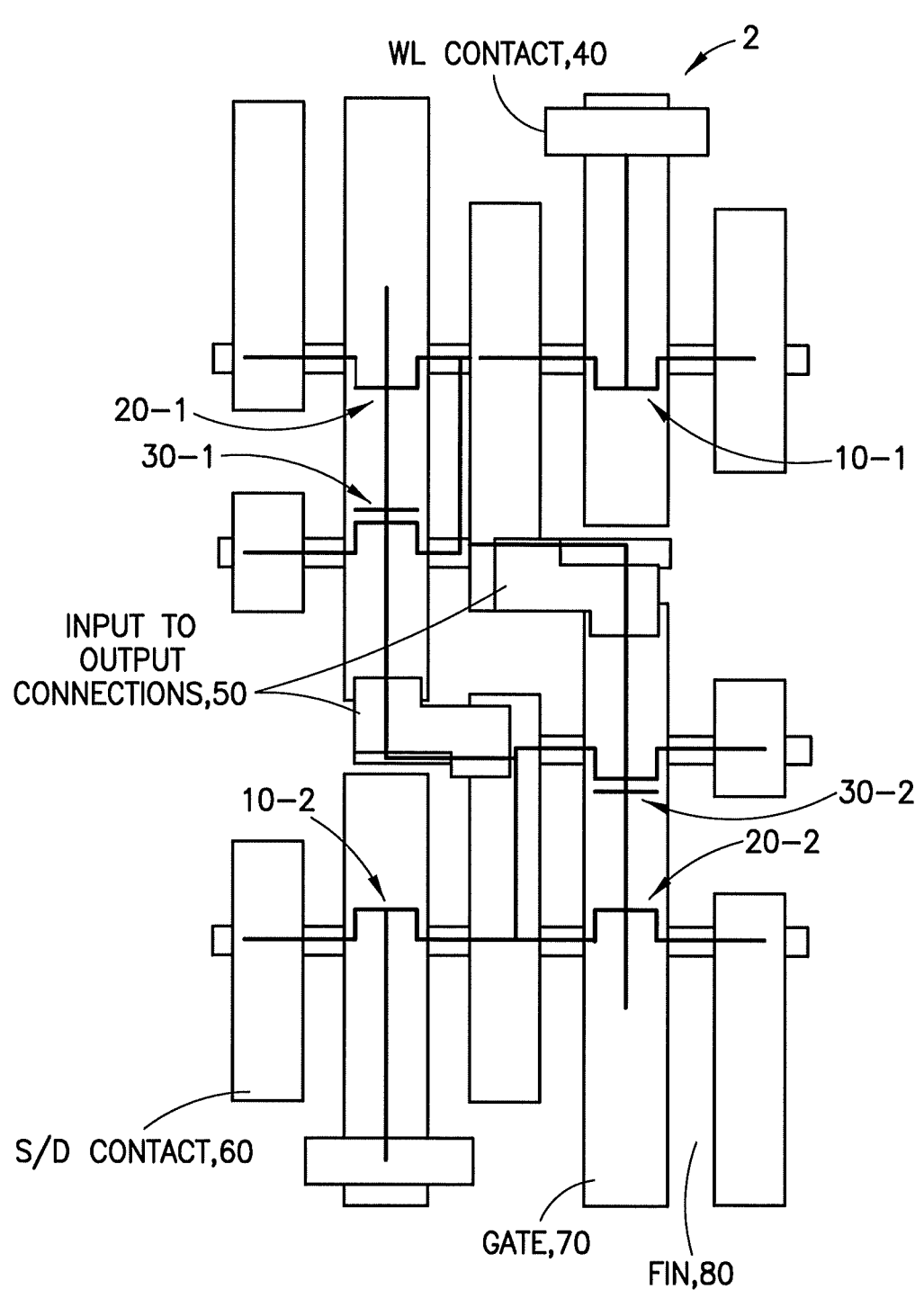
FIG. 1C illustrates a conventional semiconductor layout for a cell of the SRAM circuit in FIGS. 1A and 1B.

FIG. 1B illustrates a different way of looking at the SRAM circuit of FIG. 1A, and this is also used in FIG. 1C. In FIG. 1B, the access transistors are the pass gate transistors 10. FIG. 1C illustrates a conventional semiconductor layout 2 for a cell of the SRAM circuit 1 in FIGS. 1A and 1B. This figure illustrates a WL contact 40, input to output connections 50, source/drain (S/D) contacts 60, a gate 70, and a fin 80. The semiconductor layouts for transistors 10-1, 10-2, 20-1, 20-2, 30-1 and 30-2 are illustrated too.

A few notes are made about FIGS. 1A, 1B, and 1C. The circuitry of FIG. 1B is shown overlaid with the layout 2 of FIG. 1C. In FIG. 1A, the references 10-1 and 10-2 refer to the word line, which is the gate for the pass gate/access transistors. This is similar for the transistors 20-1, 20-2, 30-1, and 30-2. This referencing scheme is used to align with the reference scheme in FIG. 1C, and the referencing in FIG. 1B is similar.

With respect to U.S. Pat. No. 10,170,484, described above, this attempts to create transistors using different amounts of semiconductor material in different fins for different transistors to create different drive currents. Thus, different numbers of "nanoshapes" are used per transistor to create different drive currents, and using different depths (or no) "sacrificial material" to form the different numbers of "nanoshapes".

While these SRAM cells have benefits, there is still a need to make a nanosheet based SRAM have better reading and writing margins without an area penalty. That is, the conventional approach is to have large width nanosheet to have large driver strength, which leads to an area penalty. By contrast, the techniques herein have a different number of active nanosheets per transistor, which does not need to increase nanosheet width. An example is a 1-1-1 layout cell, such as making different numbers of active nanosheets on a 1-1-1 layout cell. Such that the techniques herein are good for scaling, as there is a smaller SRAM area.

For example, the following are possible implementations:

One active sheet, two floating sheets can be used to form a pull up transistor;

Two active sheets, one floating sheet can be used to form a pass gate transistor; or Three active sheets can be used for forming a pull down transistor.

Active means that a sheet is connected between source and drain, which can be biased by external voltage. Floating means that a sheet is not connected between source and drain, nor is the sheet subject to any external voltage, as the sheet is disconnected physically.

This difference in active (and floating) sheets may provide better sensing margin, as the driver strength of pull down device (three active sheets) may be greater than the driver strength of the pass gate device (two active sheets). Furthermore, this may provide better program margin, as the driver strength of the pull up device (one active sheet) may be less than the driver strength of the pass gate device (two active sheets).

Although the exemplary embodiments are characterized in SRAM circuits, other circuits may also be applicable. For instance, similar techniques may be used in gate-all-around field effect transistors (GAAFETs) and corresponding circuits with these transistors. Furthermore, although nanosheets are the main examples herein, layers may be patterned, instead of into nanosheets, into nanowires. Thus, layers for forming channels may be active or inactive, and may be formed from nanosheets or nanowires.

A process flow for forming a nanosheet and SRAM cells thereon may be as follows. FIGS. 2A to 17D illustrate formation of an integrated circuit structure for SRAM. In these figures, the term "cut" is used to describe a cross-section or cross-sectional view, as indicated in the figure showing the cut, of the integrated circuit structure during the various processing steps.

Figures 2A, 2B:
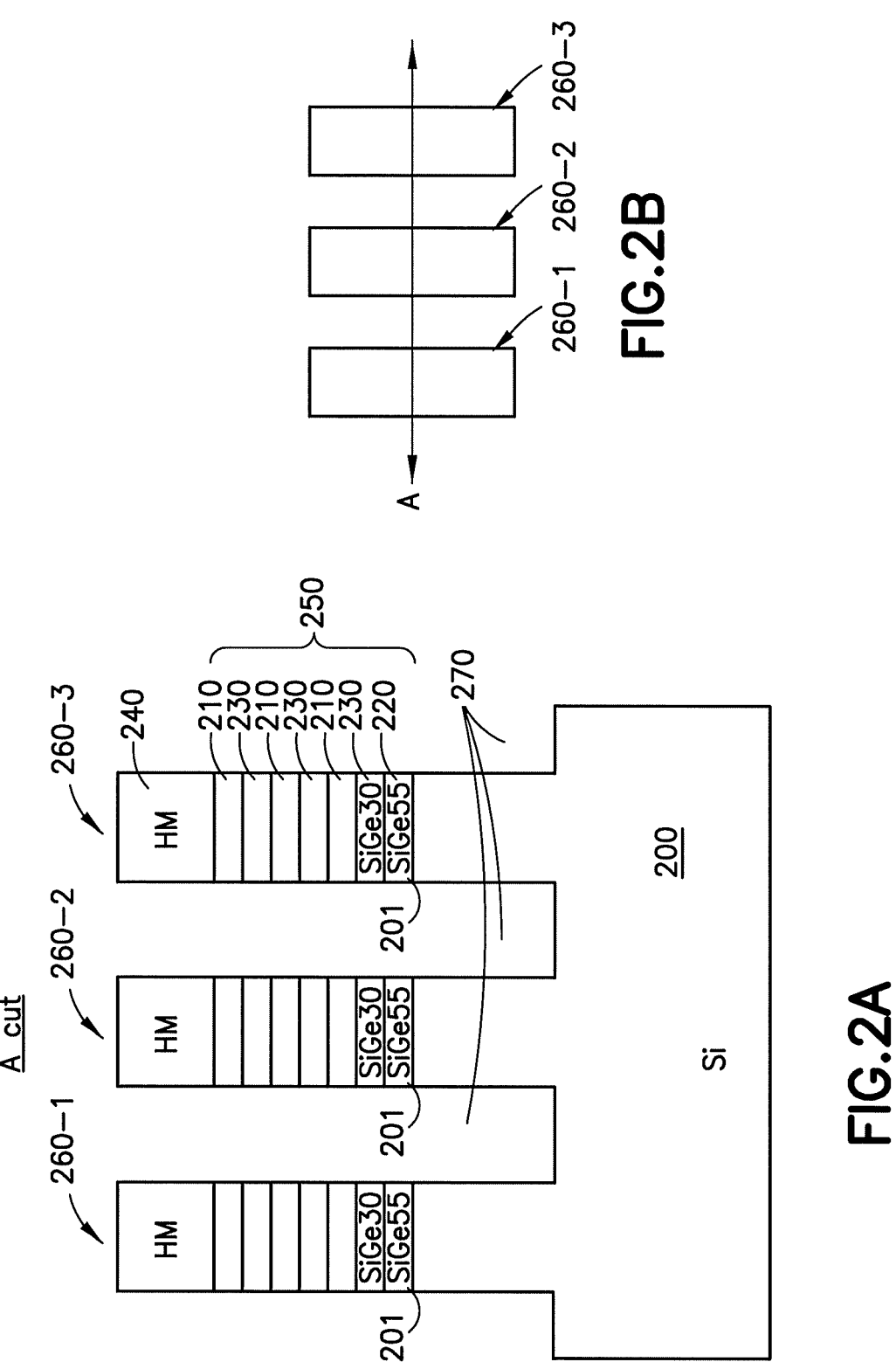

Referring to FIG. 2A, this figure illustrates the integrated circuit structure after nanosheet fin patterning and FIG. 2B shows the cut (A) of the structure being shown in FIG. 2A. Three fins 260-1, 260-2, and 260-3 are shown in both FIGS. 2A and 2B. The three fins 260-1, 260-2, and 260-2 are formed on a silicon semiconductor substrate 200 and are formed from a stack 250 comprising layers of a first semiconductor material (e.g., silicon) 210, second semiconductor material (e.g., SiGe 30%) 230, and a third semiconductor material (e.g., SiGe, silicon germanium, SiGe 55%, a dielectric insulator) 220. As can be seen, the stack 250 is multi-layer and can include alternating layers of the first semiconductor material 210 and the second semiconductor material 230. That is, after a layer of the third semiconductor material 220 is formed on the top surface 201 of the substrate 200, an initial layer of the second semiconductor material 230 can be formed on the top surface of the third semiconductor material 220, an initial layer of the first semiconductor material 210 can be formed on the initial layer of the second semiconductor material 230, another layer of the second semiconductor material 230 can be formed on the initial layer of the first semiconductor material 210, and so on. These alternating layers can be formed, for example, by epitaxial deposition such that the second semiconductor material 230 and the first semiconductor material 210 are different monocrystalline semiconductor materials. For example, the first semiconductor material 210 can be monocrystalline silicon. The second semiconductor material 230 can be monocrystalline silicon germanium (e.g., SiGe 30%) or any other suitable semiconductor material, which can be used to grow monocrystalline silicon and which can be selectively etched away from monocrystalline silicon during subsequent processing.

This example includes a hard mask (HM) 240 deposited over the top surface of the fins 260. In the examples herein, "top" is used to refer to structures away from the substrate 200, while "bottom" is used to refer to structures near substrate 200. There are three recesses 270 shown already formed in the substrate 200, where the recesses 270 are recessed from the original top surface 201. These recesses will be filled as described in FIG. 3A. The types of material have been labeled as first (210), second (230), and third (220) semiconductor material, but these are also considered to be layers 210, 230, and 220 herein. It is noted that each layer 210, 220, 230 can be considered to be a "sheet", which sheets are shown already patterned into fins in FIG. 2A.

Figures 3A, 3B:
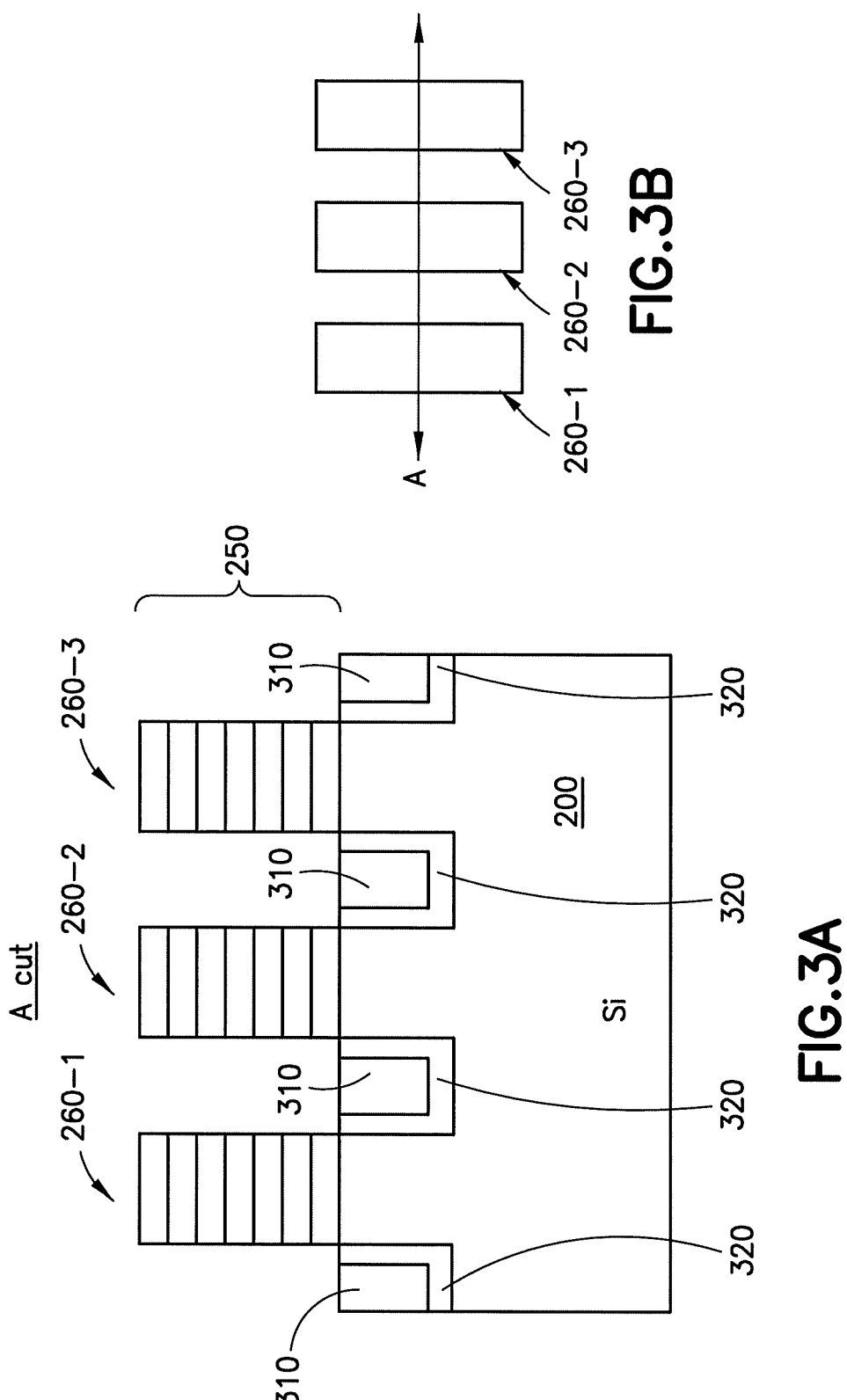
FIG. 3A illustrates the integrated circuit structure after an $SiO_2$ recess to reveal an active nanosheet fin and FIG. 3B shows the cut of the structure being shown in FIG. 3A.

FIG. 3A illustrates the integrated circuit structure after a $SiO_2$ recess (forming recesses 310) to reveal an active nanosheet fin and FIG. 3B shows the cut (A) of the structure being shown in FIG. 3A. The recesses 270 have been filled with material 310, which could be $SiO_2$ or other insulator, and layer 320 of an SiN liner to prevent oxidation on Si body. The HM 240 has been removed.

Figures 4A, 4B:
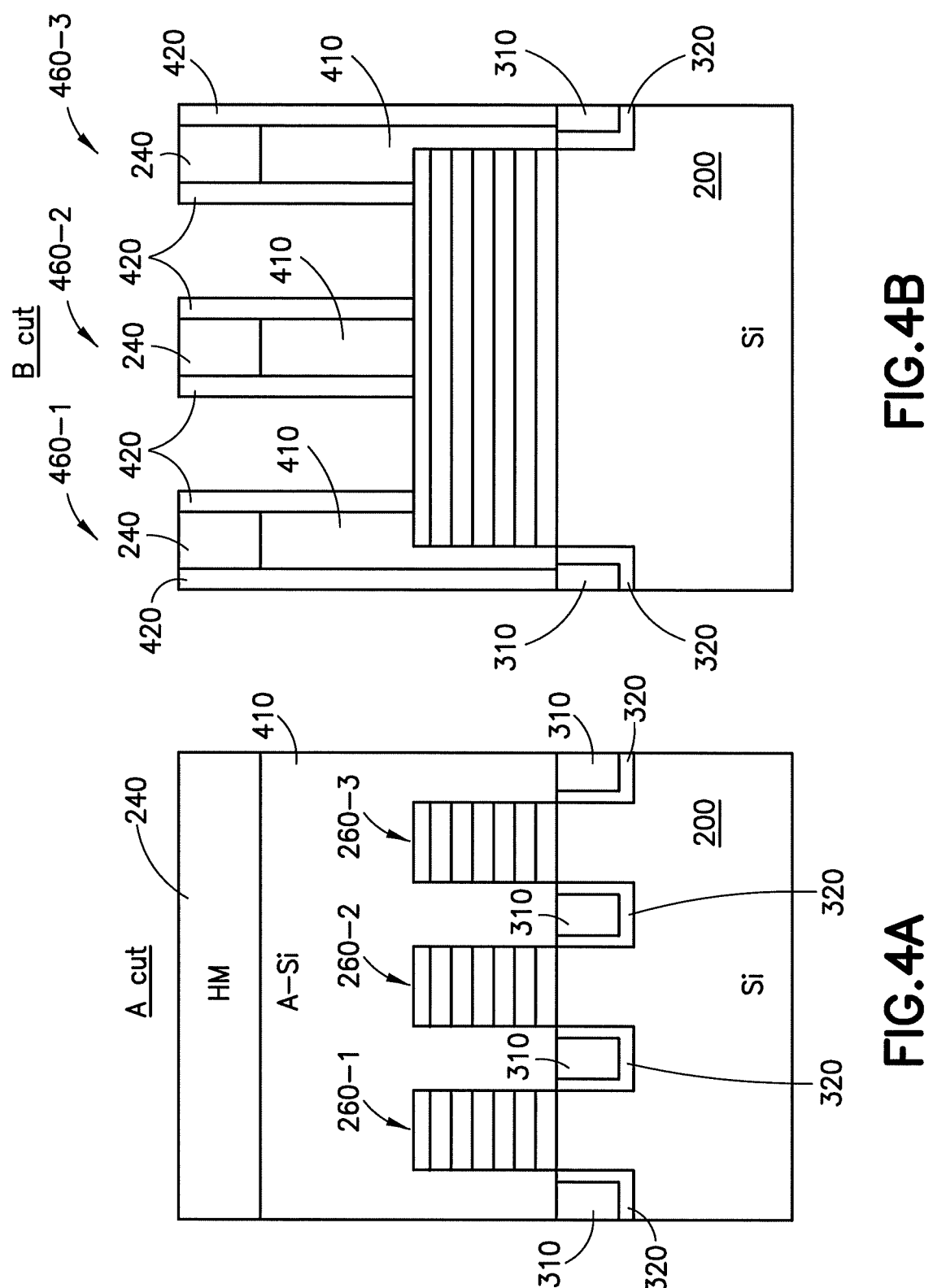
FIGS. 4A, 4B, and 4C illustrate the integrated circuit structure after dummy gate patterning.
Figure 4C:
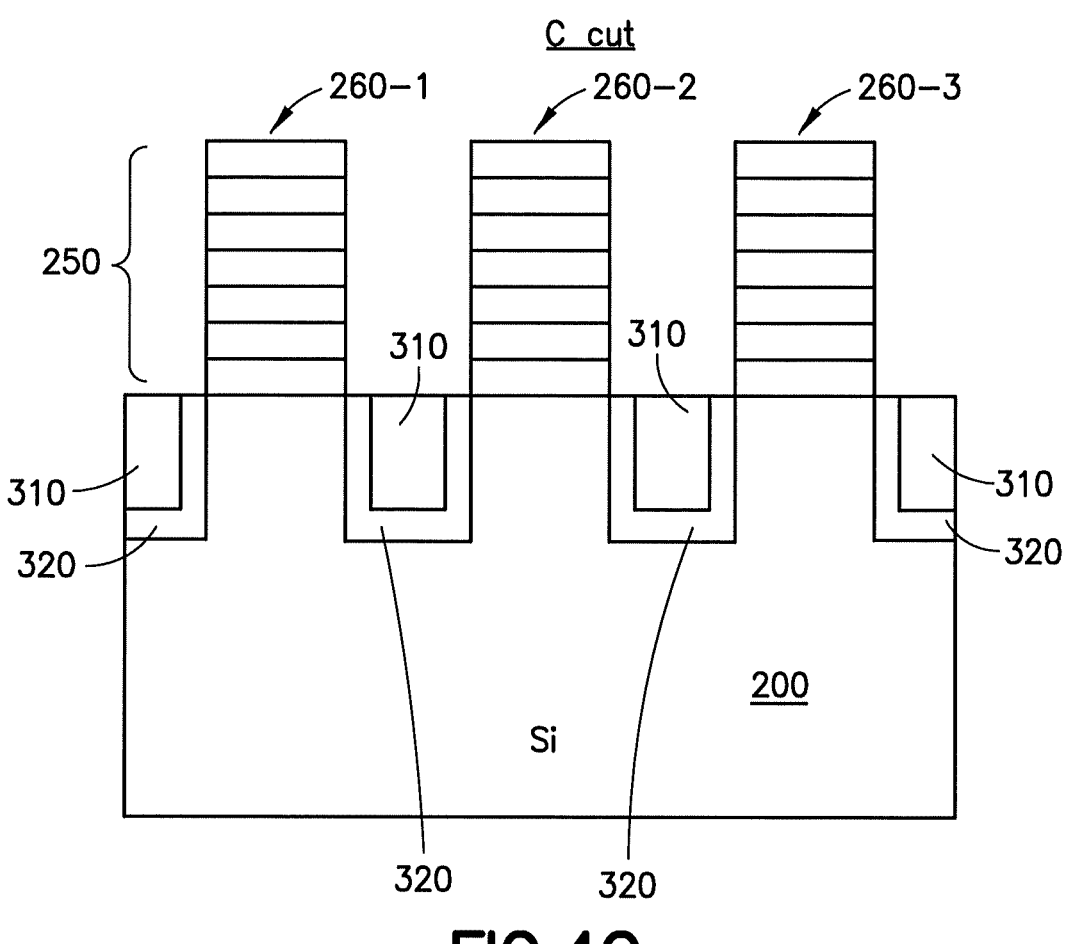
Figure 4D:
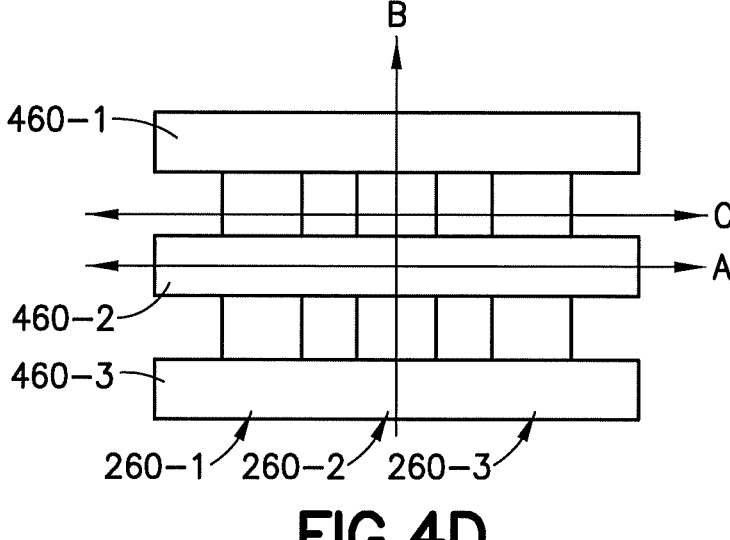
FIG. 4D shows the cuts (A, B, and C, respectively) of the structures being shown in FIGS. 4A, 4B, and 4C.

FIGS. 4A, 4B, and 4C illustrate the integrated circuit structure after dummy gate patterning, and FIG. 4D shows the cuts (A, B, and C, respectively) of the structures being shown in FIGS. 4A, 4B, and 4C. There is a layer of A-Si (amorphous silicon) 410 that has been deposited and removed to form fins 460-1, 460-2, and 460-3. The fins 460 are covered with a hard mask 240 and the combination of fins 460 and hard mask 240 have material 420 (e.g., made from a low K SiN, silicon nitride, or other suitable insulator and electrical isolator such as SiBCN or SiOCN) on their sidewalls, e.g., to create sidewall spacers. As is known, "low K" refers to a material with a small relative dielectric constant (the "K") relative to silicon dioxide.

Figures 5A, 5B:
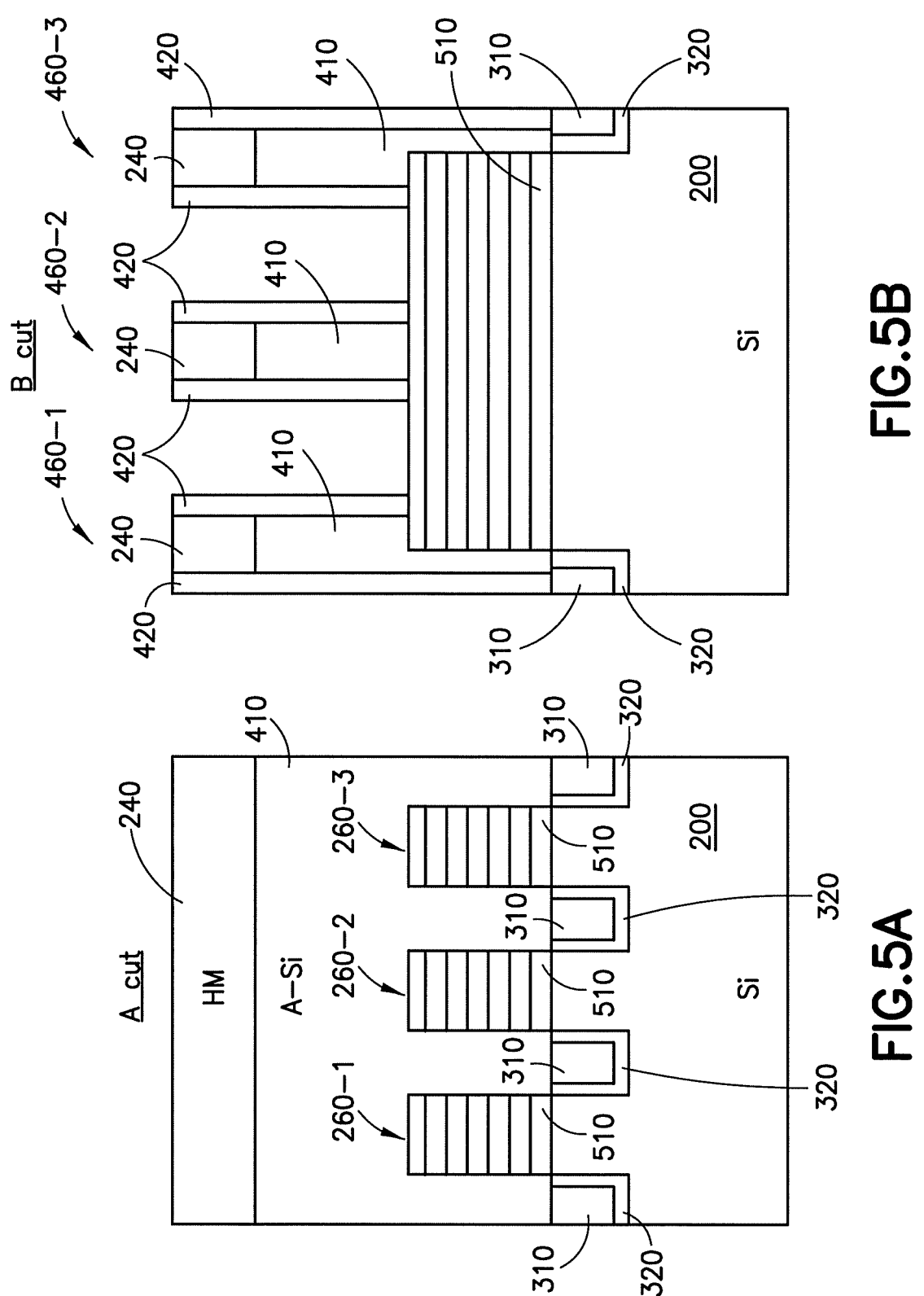
FIGS. 5A, 5B, and 5C illustrate the integrated circuit structure after bottom dielectric insulator removal.
Figure 5C:
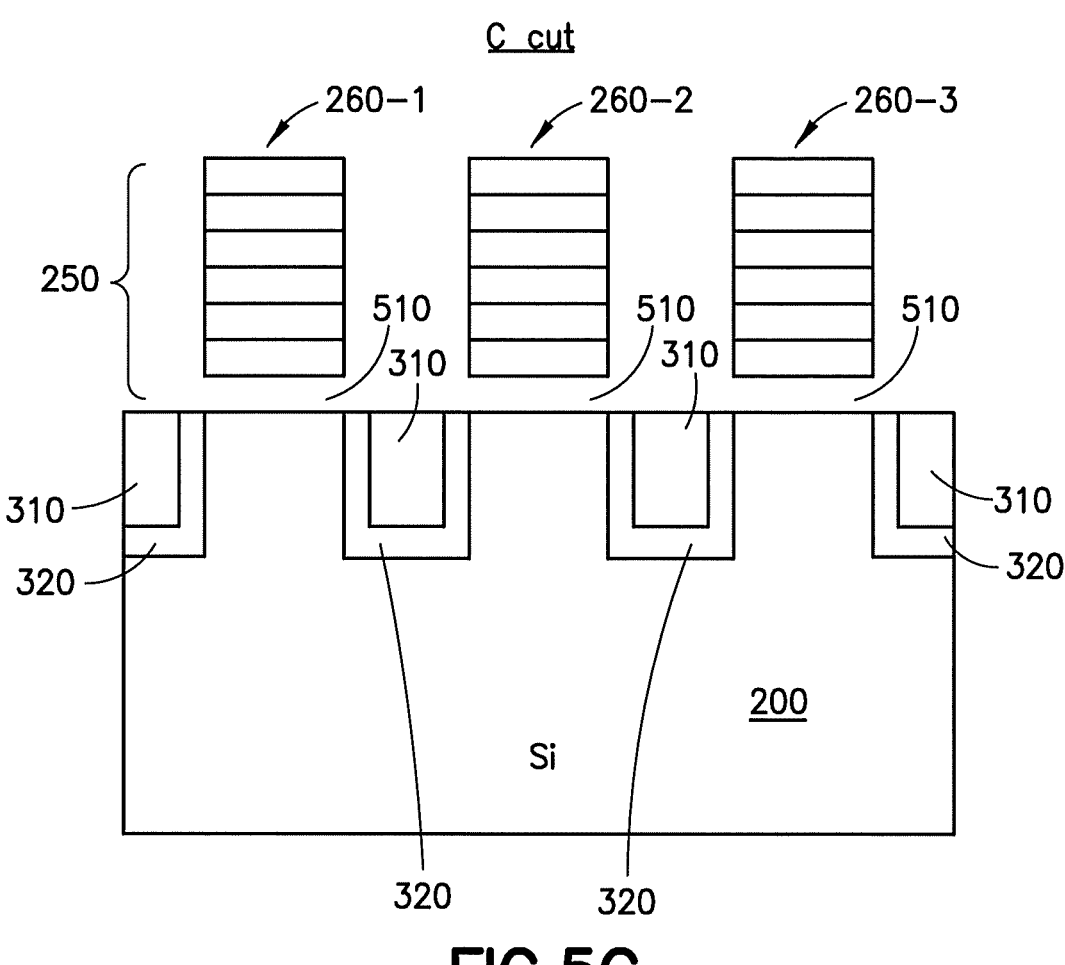
Figure 5D:
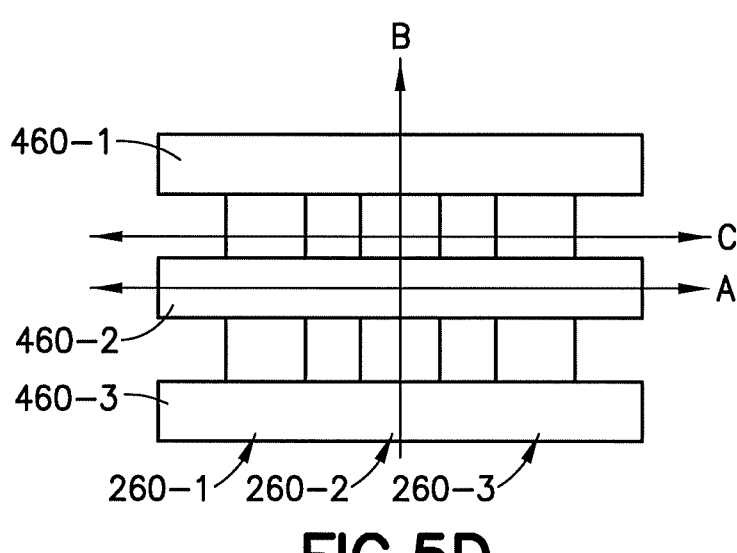
FIG. 5D shows the cuts (A, B, and C, respectively) of the structures being shown in FIGS. 5A, 5B, and 5C.

FIGS. 5A, 5B, and 5C illustrate the integrated circuit structure after bottom dielectric insulator removal, and FIG. 5D shows the cuts (A, B, and C, respectively) of the structures being shown in FIGS. 5A, 5B, and 5C. The dielectric insulator that has been removed is third semiconductor material 220, and the removal creates voids 510.

Figures 6A, 6B:
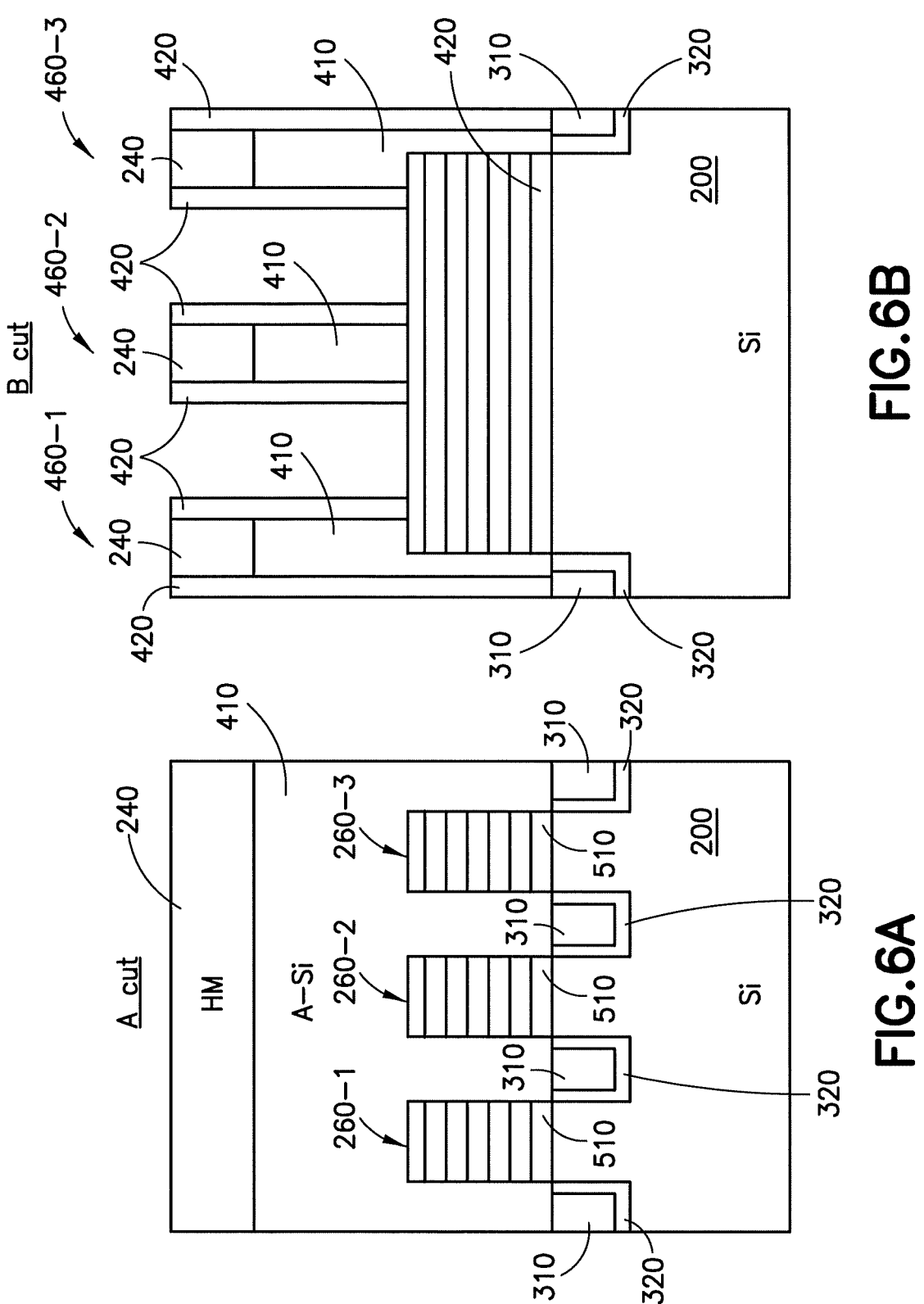
FIGS. 6A, 6B, and 6C illustrate the integrated circuit structure after gate spacer formation.
Figure 6C:
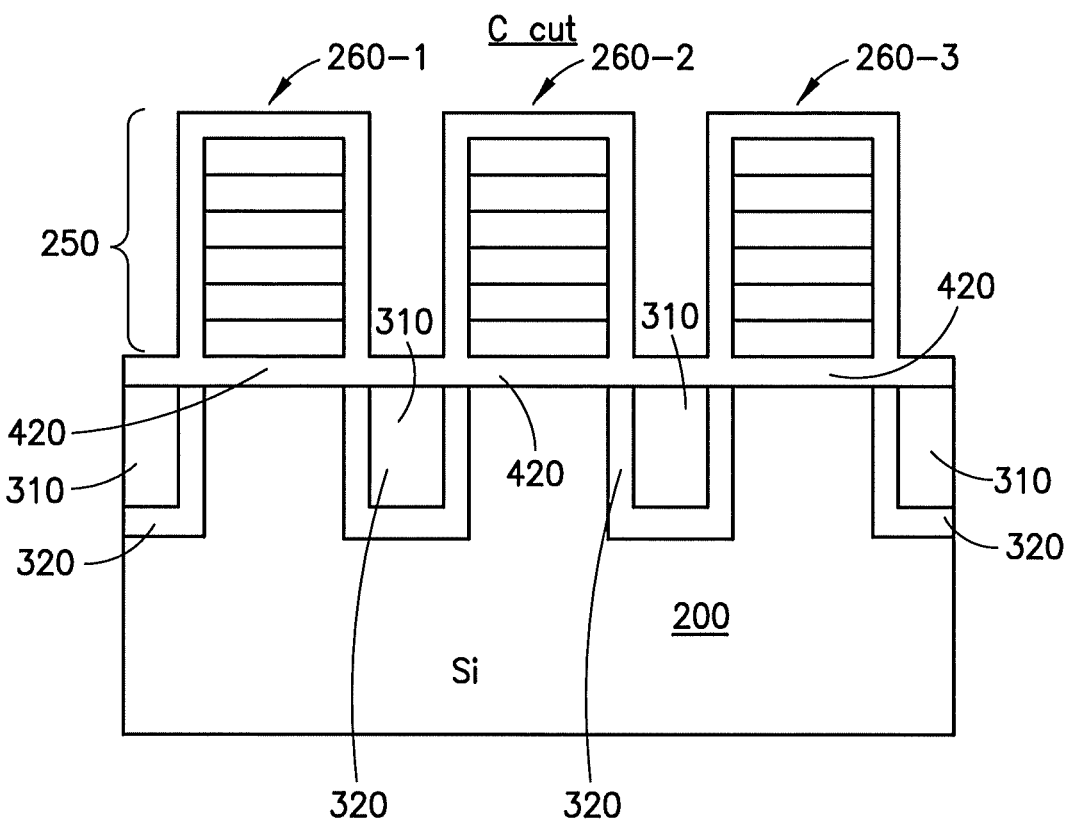
Figure 6D:
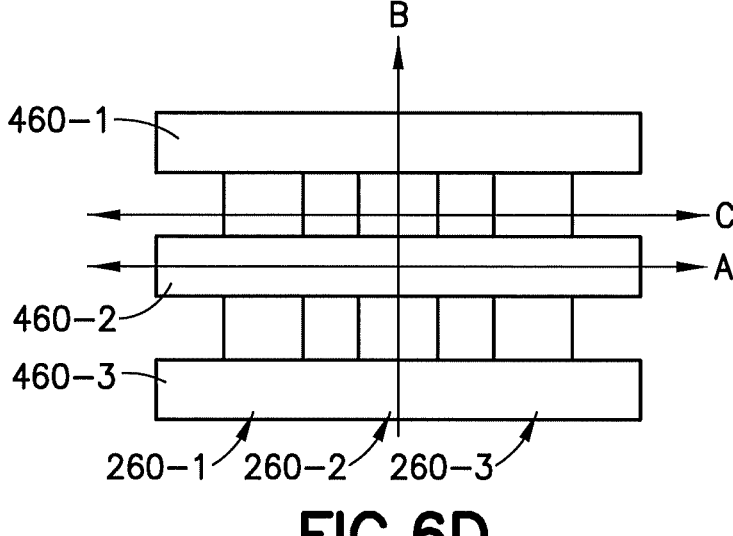
FIG. 6D shows the cuts (A, B, and C, respectively) of the structures being shown in FIGS. 6A, 6B, and 6C.

FIGS. 6A, 6B, and 6C illustrate the integrated circuit structure after gate spacer formation, and FIG. 6D shows the cuts (A, B, and C, respectively) of the structures being shown in FIGS. 6A, 6B, and 6C. In this example, the voids 510 have been filled (e.g., via an atomic vapor deposition process) with material 420 that acts as a gate spacer.

Figures 7A, 7B:
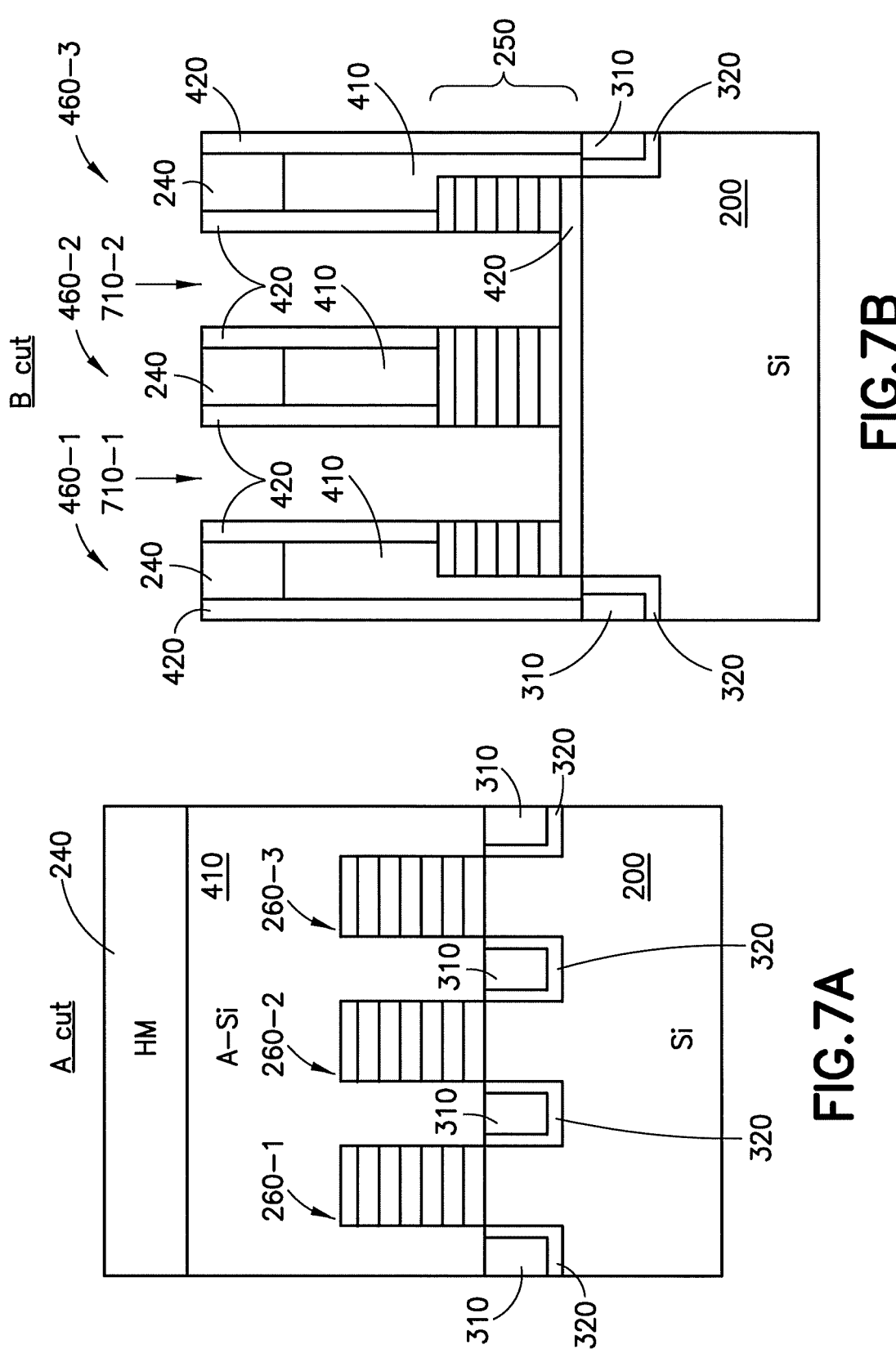
FIGS. 7A, 7B, and 7C illustrate the integrated circuit structure after a nanosheet recess process.
Figure 7C:
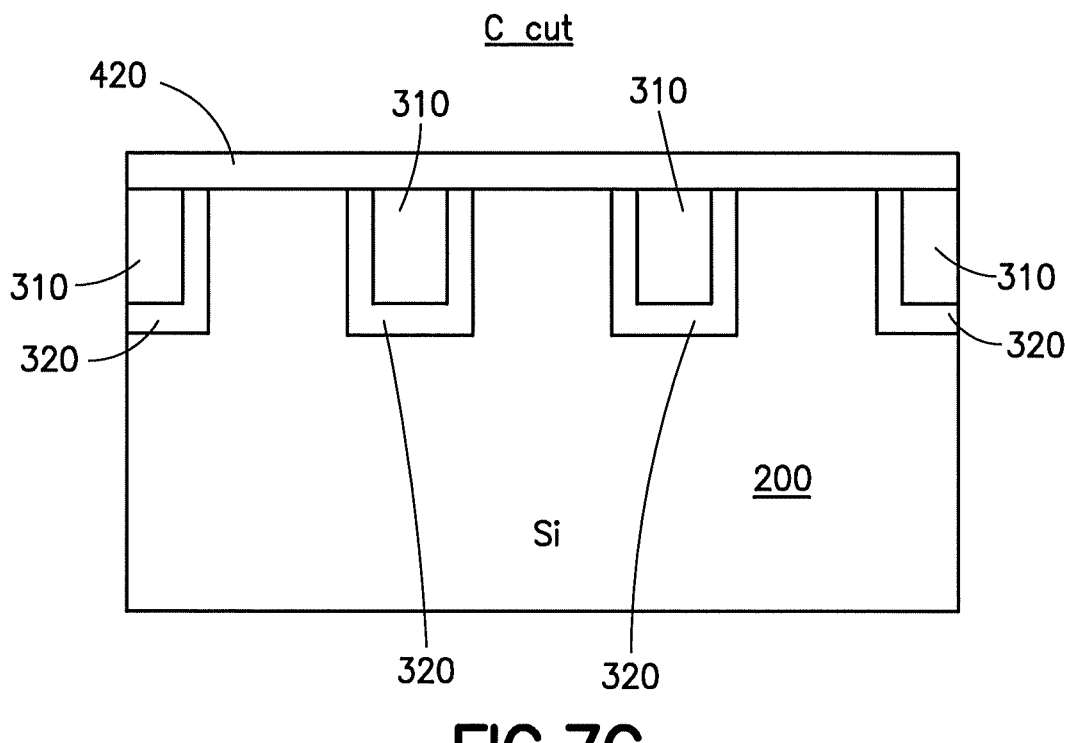
Figure 7D:
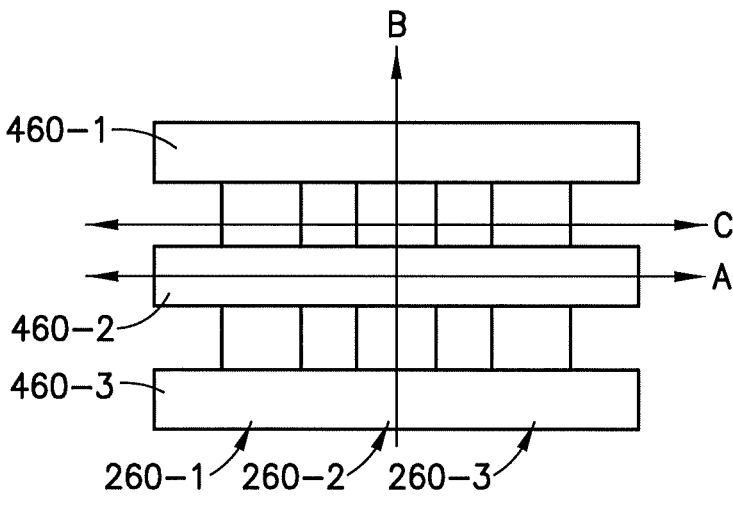
FIG. 7D shows the cuts (A, B, and C, respectively) of the structures being shown in FIGS. 7A, 7B, and 7C.

FIGS. 7A, 7B, and 7C illustrate the integrated circuit structure after a nanosheet recess process, and FIG. 7D shows the cuts (A, B, and C, respectively) of the structures being shown in FIGS. 7A, 7B, and 7C. FIG. 7A is similar to FIG. 6A for cut A, but FIG. 7B (relative to FIG. 6B) illustrates the stack 250 has been removed in cut B, stopping at the material 420 in the trench 710-1 between fins 460-1 and 460-2, and in the trench 710-2 between fins 460-2 and 460-3. In cut C, FIG. 7C illustrates that the fins 260-1, 260-2, and 260-3 have been removed (compare with FIG. 6C), stopping at layer 420.

Figures 8A, 8B:
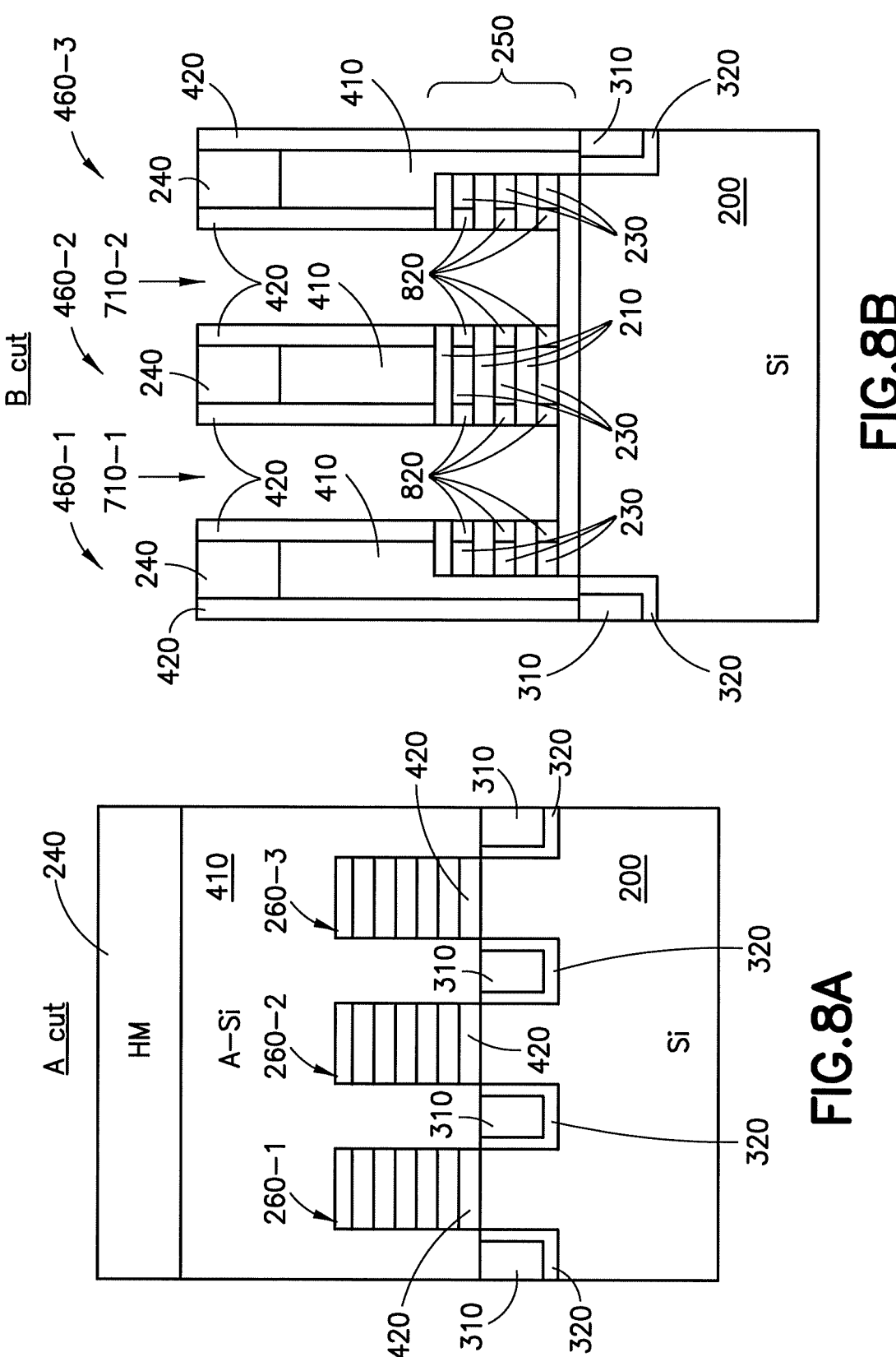
FIGS. 8A, 8B, and 8C illustrate the integrated circuit structure after an inner spacer formation and etch back process.
Figure 8C:
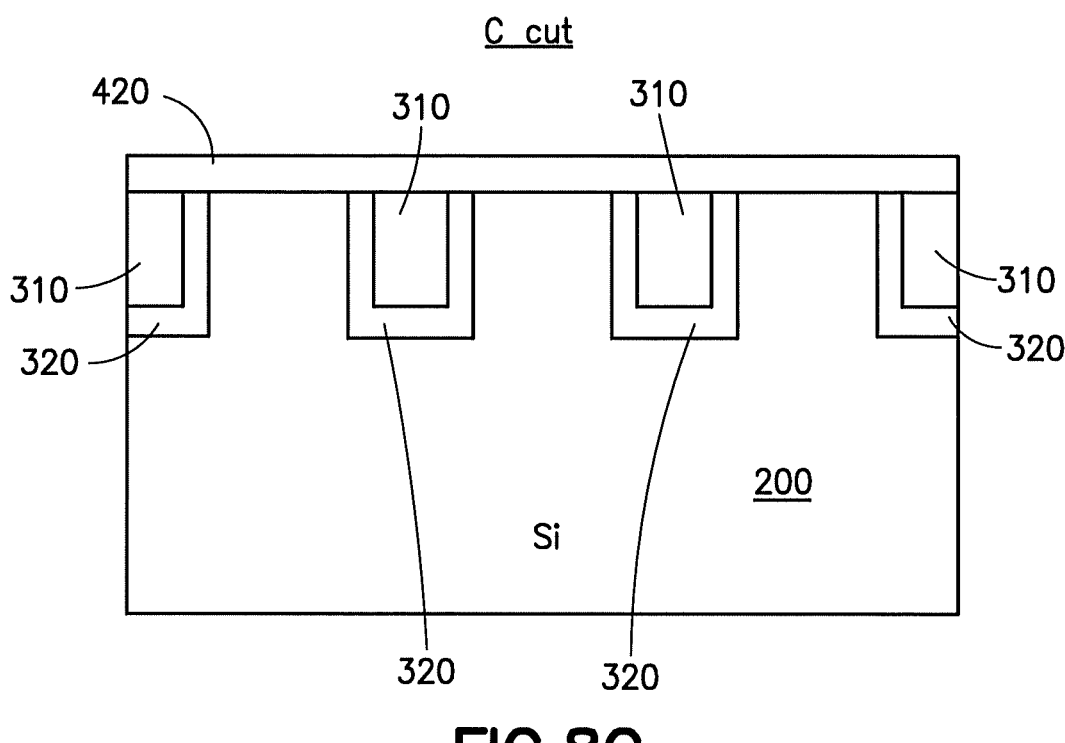
Figure 8D:
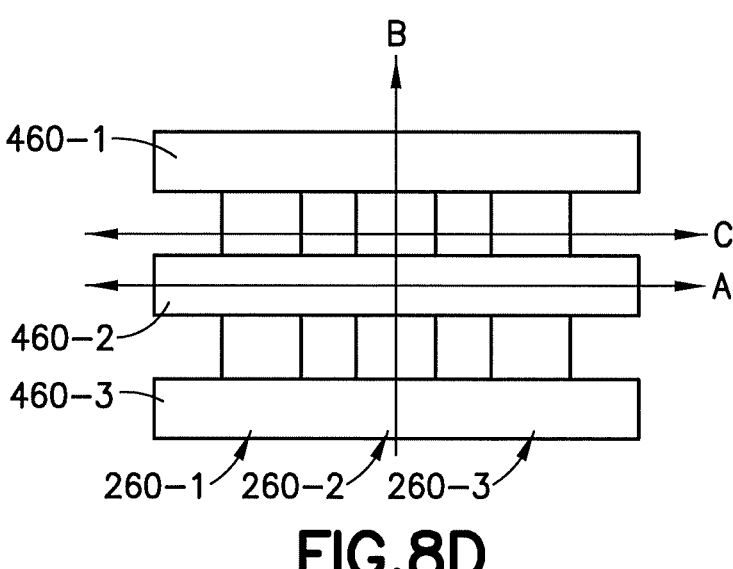
FIG. 8D shows the cuts (A, B, and C, respectively) of the structures being shown in FIGS. 8A, 8B, and 8C.

FIGS. 8A, 8B, and 8C illustrate the integrated circuit structure after an inner spacer formation and etch back process, and FIG. 8D shows the cuts (A, B, and C, respectively) of the structures being shown in FIGS. 8A, 8B, and 8C. FIG. 8A is similar to FIG. 7A, and FIG. 8C is similar to FIG. 7C. The inner spacers 820 have been formed, e.g., from material 420, after an etch back of layers 210, then deposition of material 420 into these areas.

At this point, a number of other steps are taken. These steps are explained on a transistor basis, using pass gate transistors, pull up transistors, and pull down transistors. These steps are as follows.

1) A first lithographic process (Litho 1) is performed, where the PU area is open for a mask (referred to as "PU open"); the PD area is closed (e.g., covered) for the mask (referred to as "PD closed"); and the pass gate transistor is open for the mask (referred to as "pass gate closed").

2) An OPL coating, OPL (optical planarization layer) recess and Si dent processes are performed.

3) A second lithographic process (Litho 2) is performed, where the PU area is open; the PD area is closed; and the pass gate area is closed.

4) Another set of OPL coating, OPL recess and Si dent processes are performed.

5) An inner spacer deposit/etch back process is performed.

Figure 9A:
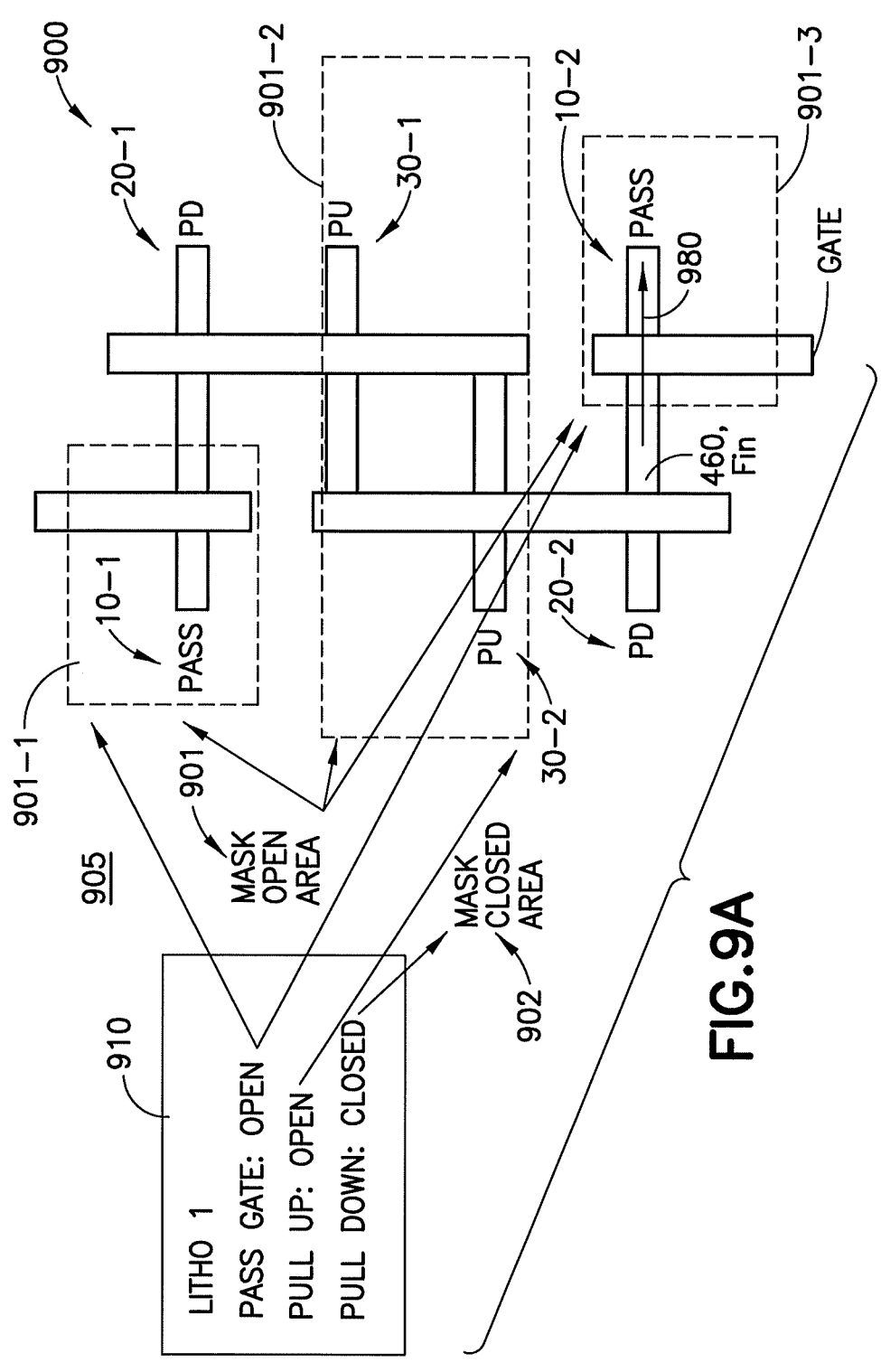
FIG. 9A outlines the mask operations associated with a first lithographic process.

FIG. 9A outlines the mask operations associated with a first lithographic process (Litho 1), which corresponds to step (1) above. Note that the layout of FIGS. 4D, 5D, 6D, 7D, and 8D is a general three fin-three gate lines layout, which is common for all other devices. That is, FIGS. 2A-FIG. 8D are conventional flow on general three fin-three gate lines layout. FIG. 9A, however, is a specific layout for SRAM, which used as a main example herein.

FIGS. 9B, 9C, 9D, and 9E illustrate, respectively, the integrated circuit structure after an OPL coating process, an OPL recess process, an Si dent process, and an OPL removal process for pass gate transistor 10-1. These correspond to step (2) above. Note that the reference numbering used here for the transistors (10-1, 10-2, 20-2, 20-2, 30-1, and 30-2) corresponds to the numbering in FIG. 1A, for ease of reference. Note also that FIG. 9B to FIG. 9E are cross sections along the arrow 980 location.

Block 910 of FIG. 9A shows that for Litho 1, the follow mask areas are used: the pass gate (areas) are open; the pull up (area) is open; and the pull down (area) is closed. For the semiconductor layout 900, a mask 905 is assumed to cover the layout 900. There are mask open areas 901, which are shown via areas 901-1, 901-2, and 901-3. Areas outside the rectangles 901-1, 901-2, and 901-3 are assumed to be a mask closed area 902. That is, after a lithography process, area 901 does not have photo resist and area 902 has photo resist. lithography is only operational in mask open areas 901 and is not operational in mask closed area 902. FIGS. 9B, 9C, 9D, and 9E are performed using the mask 905.

Figure 9C:
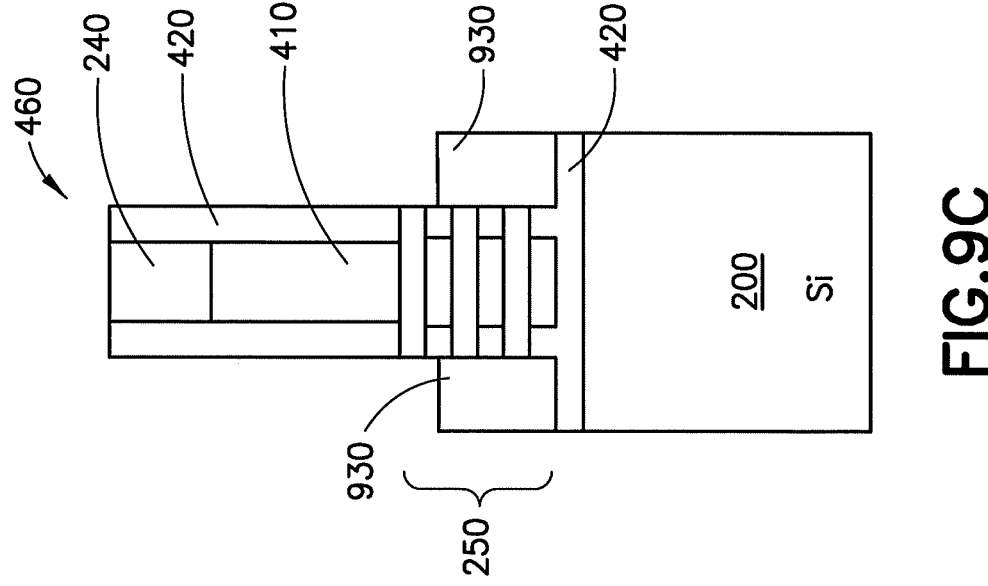
FIGS. 9B, 9C, 9D, and 9E illustrate, respectively, the integrated circuit structure after an OPL coating process, an OPL recess process, an Si dent process, and an OPL removal process associated with the first lithographic process for a pass gate transistor.
Figure 9B:
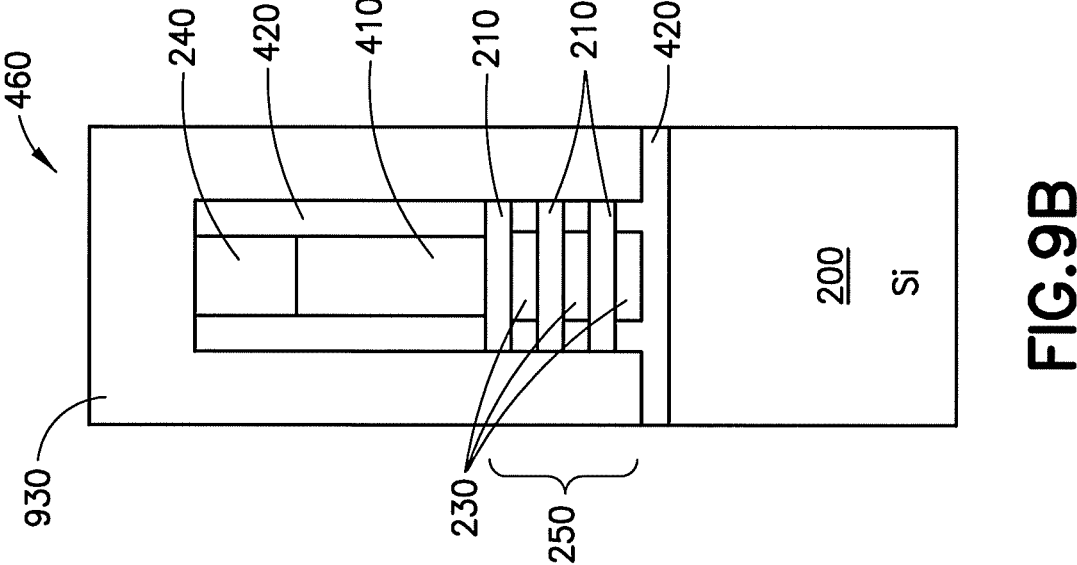
Figure 9E:
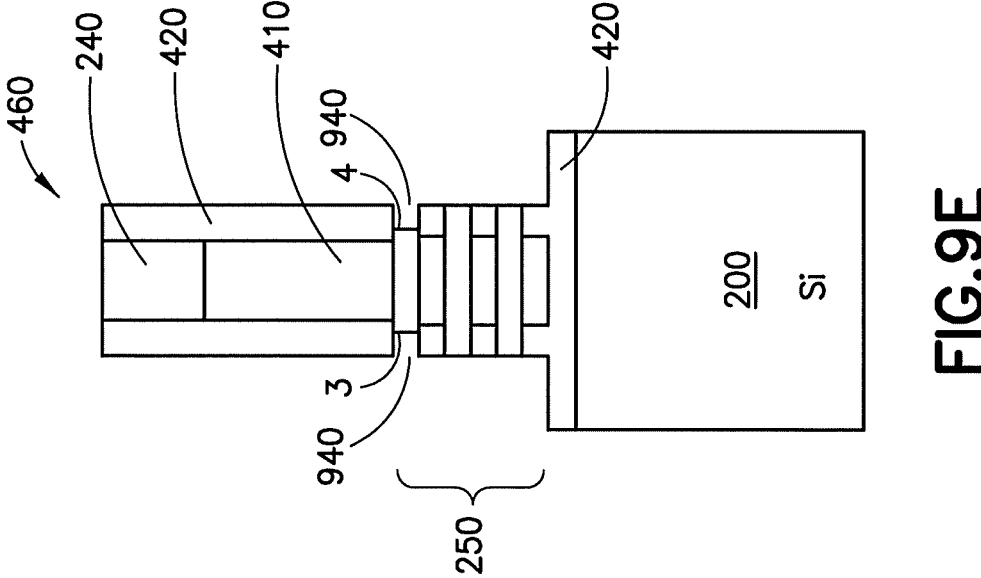
Figure 9D:
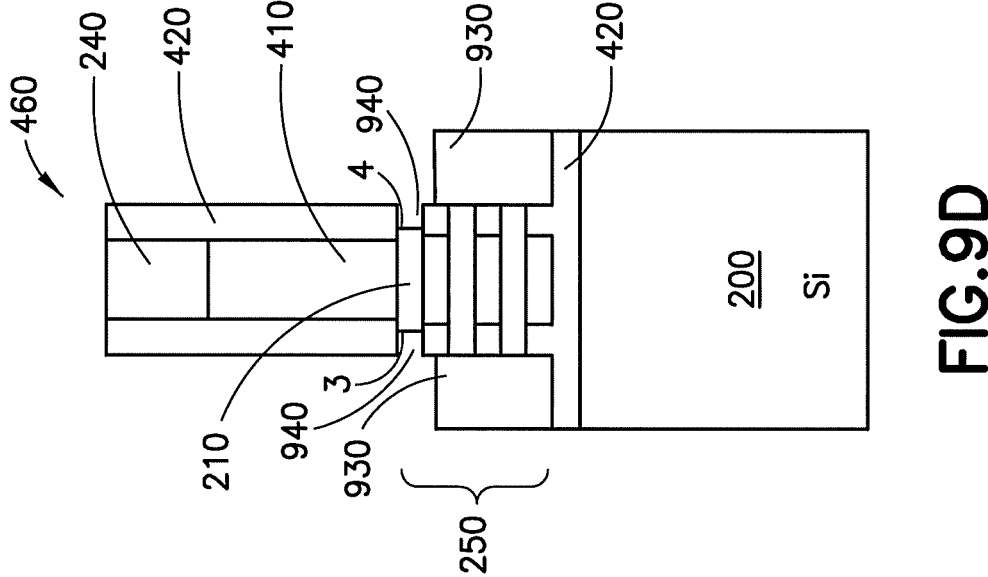

In FIG. 9B, a semiconductor layout for the pass gate transistor 10-1 is shown after completion of an OPL coating process, where layer 930 is added. OPL coating 930 can be a carbon polymer or similar. The layer 930 covers the hard mask 240, the material 420 (as sidewall spacers and sides of the gate spacer layer), and the sides of the stack 250. FIG. 9C shows a result after an OPL recess process to expose a top sheet only, where part of the OPL layer has been removed. FIG. 9D illustrates a result of a silicon (Si) dent process, where a top layer of first semiconductor material 210 has had cavities 940 formed, which are dents in the uppermost layer 210. These form lateral surfaces 3 and 4 onto which an insulator can later be formed. That is, an isotropic etch process that is selective for the first semiconductor material 210 over the material 420 or OPL coating 930 can be performed to etch back (or "dent") the exposed vertical surfaces of the first semiconductor material 210 only, thereby creating the shallow cavities ("dents") 940. FIG. 9E illustrates optional OPL removal, which can be performed if desired. OPL can be removed by $O_2$ plasma. The FIG. 9E step can be optional as there is another OPL coating in next processing steps of the second lithographic process.

Figure 10A:
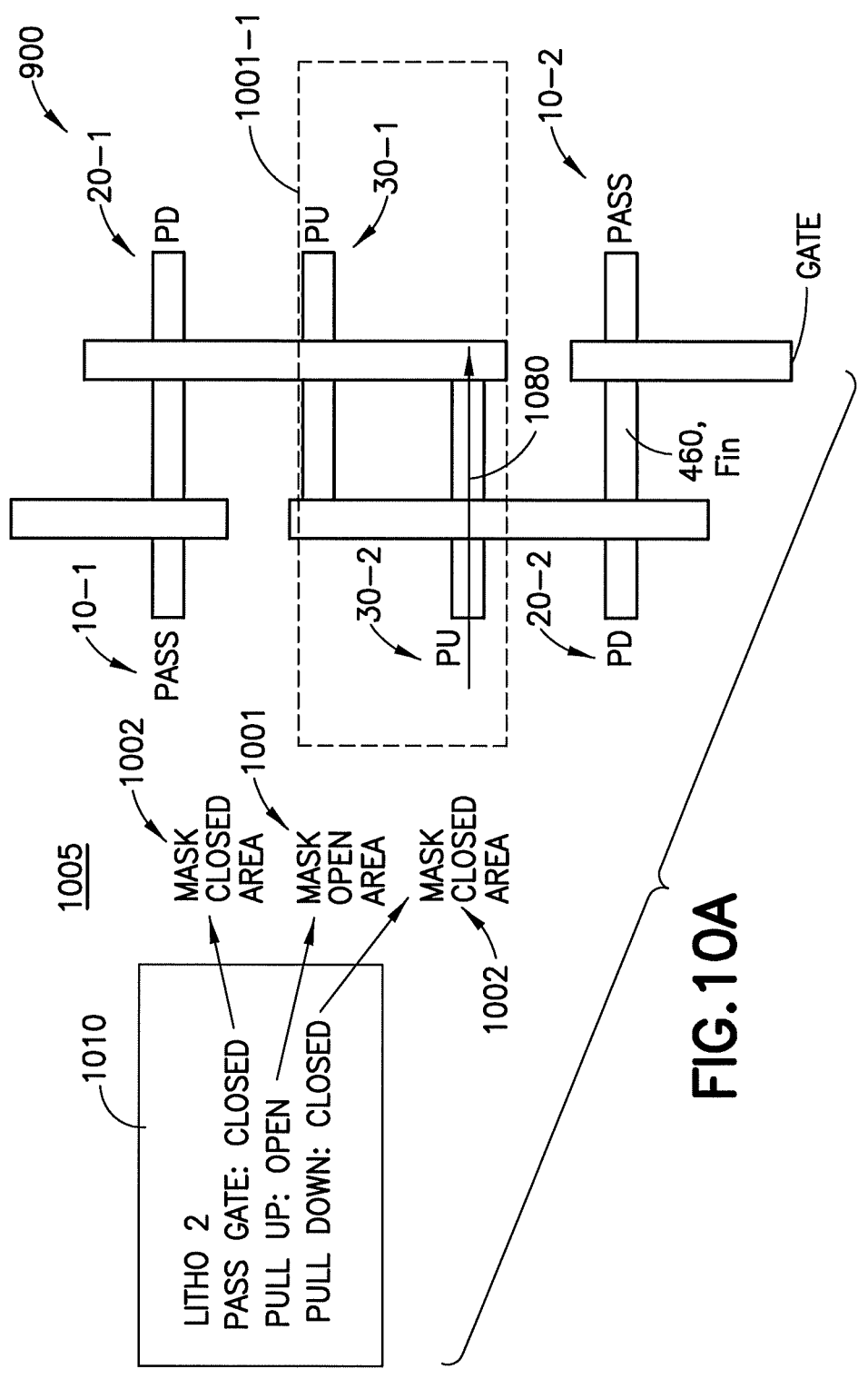
FIG. 10A outlines the mask operations associated with a second lithographic process.

Turning to FIG. 10A, this figure outlines the mask operations associated with a second lithographic process (Litho 2), which corresponds to step (3) above. In this example, block 1010 of FIG. 10A shows that for Litho 2, the following mask areas are used: the pass gate (area) is closed; the pull up (area) is open; and the pull down (area) is closed. For the semiconductor layout 900, a mask 1005 is assumed to be over the layout 900. There is a mask open area 1001, which is shown via area 1001-1. Areas outside the rectangle 1001-1 are assumed to be a mask closed area 1002. That is, lithography is only operational in mask open areas 1001 and is not operational in mask closed areas 1002. FIGS. 10B, 10C, 10D, and 10E are performed using the mask 905.

Figures 10B, 10C:
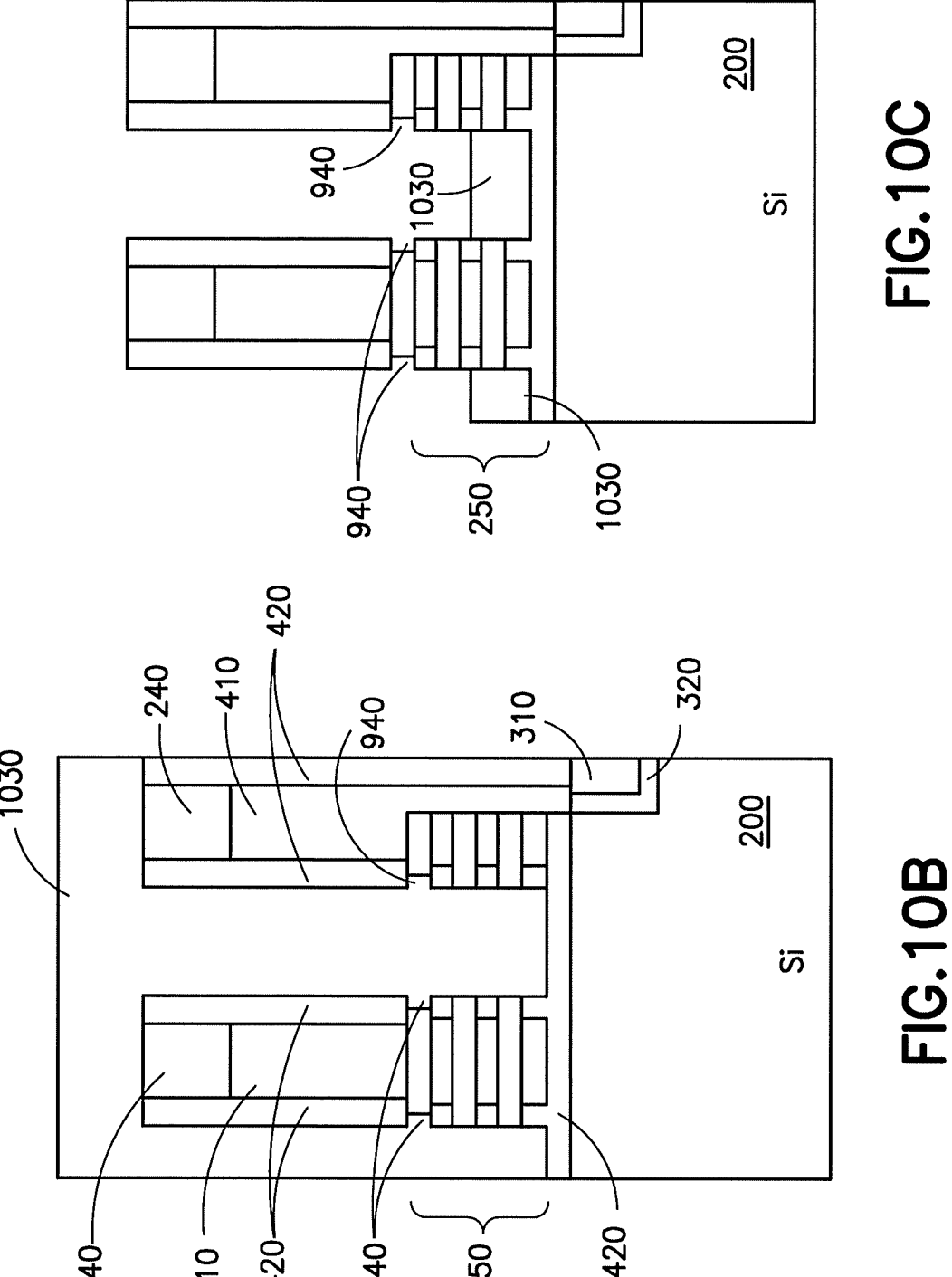
FIGS. 10B, 10C, 10D, and 10E illustrate, respectively, the integrated circuit structure after an OPL coating process, an OPL recess process, an Si dent process, and an OPL removal process associated with the second lithographic process for a pull up transistor.
Figure 10E:
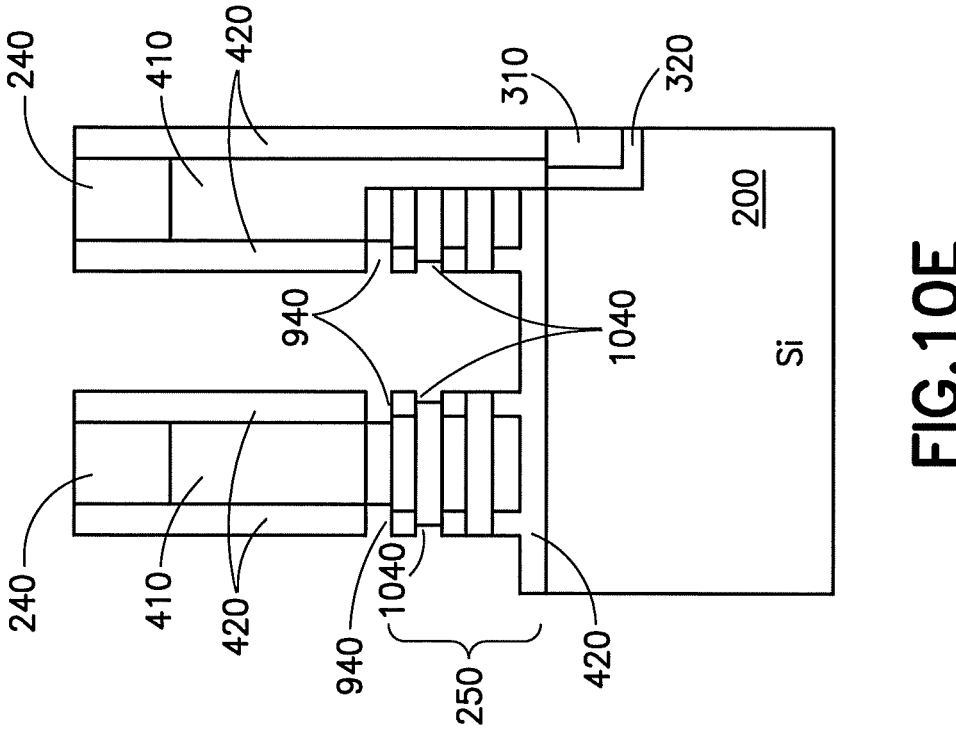
Figure 10D:
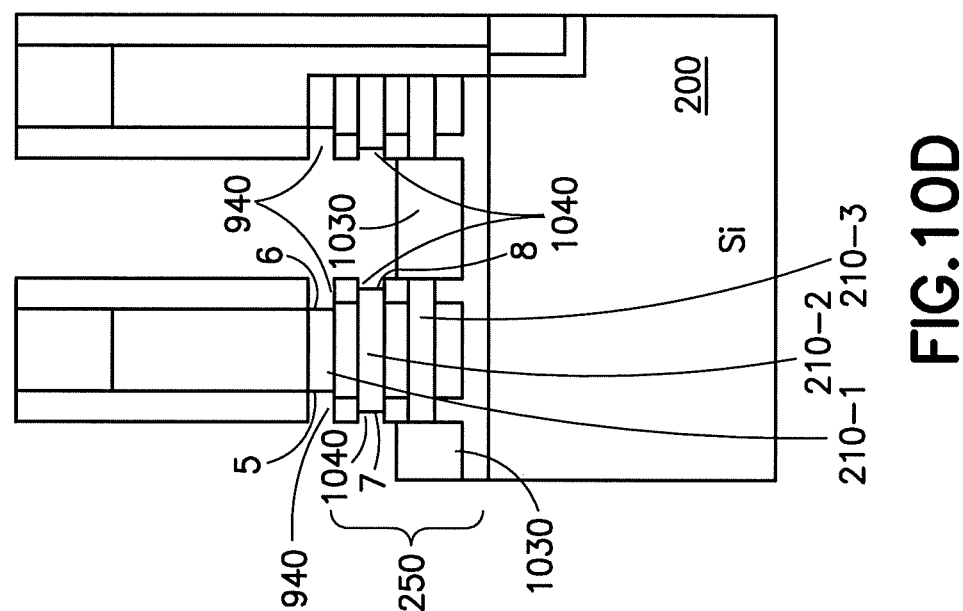

FIGS. 10B to 10E are cross sections along the arrow 1080. FIGS. 10B, 10C, 10D, and 10E illustrate, respectively, the integrated circuit structure after an OPL coating process, an OPL recess process, an Si dent process, and an OPL removal process associated with the second lithographic process for a pull up transistor. These figures correspond to step (4) above. In FIG. 10B, a semiconductor layout is illustrated for the pull up transistors 30-1 and 30-2 after an OPL coating process has been performed. The OPL layer 1030 has been formed and covers the hard mask 240, the material 420 (as sidewall spacers and sides of the gate spacer layer), cavities 940, and the sides of the stack 250. FIG. 10C shows a result after an OPL recess process, where part of the OPL layer 1030 has been removed. FIG. 10D illustrates a result of a silicon (Si) dent process, where the cavities 940 in a top layer of first semiconductor material 210 have been enlarged (thereby forming lateral surfaces 5 and 6) and cavities 1040 in a third layer in the stack 250 that are the first semiconductor material 210 are formed. Cavities 1040 also form the lateral surfaces 7 and 8. That is, an isotropic etch process that is selective for the first semiconductor material 210 over the material 420 or OPL coating 930 can be performed to etch back the exposed vertical surfaces of the first semiconductor material 210 only, thereby enlarging the cavities 940 (i.e., further denting this layer 210) and creating (i.e., denting) the shallow cavities 1040. FIG. 10E illustrates OPL removal, and the two dents 940 and 1040. Note that these have at least two different widths: the width of the uppermost layer 210-1 is smaller than the width of the middle layer 210-2 (which is smaller in width than the lowest layer 210-3).

Figures 11A, 11B:
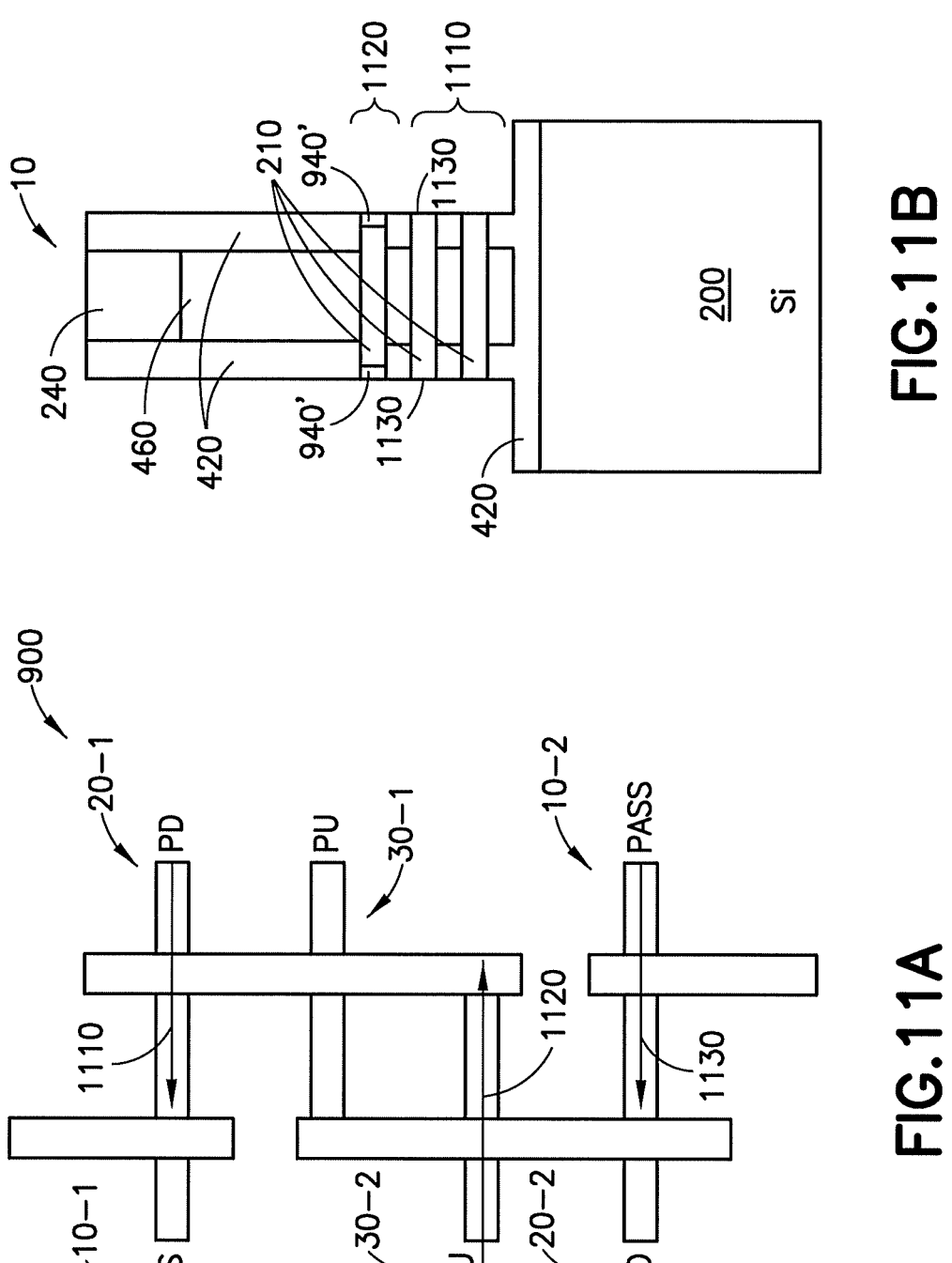
FIG. 11A illustrates a semiconductor layout corresponding to FIGS. 11B, 11C, and 11D.
FIGS. 11B, 11C, and 11D illustrate the integrated circuit structure after a spacer deposition and etch back process, respectively, for a pass transistor, a pull up transistor, and a pull down transistor from FIG. 11A.
Figures 11C, 11D:
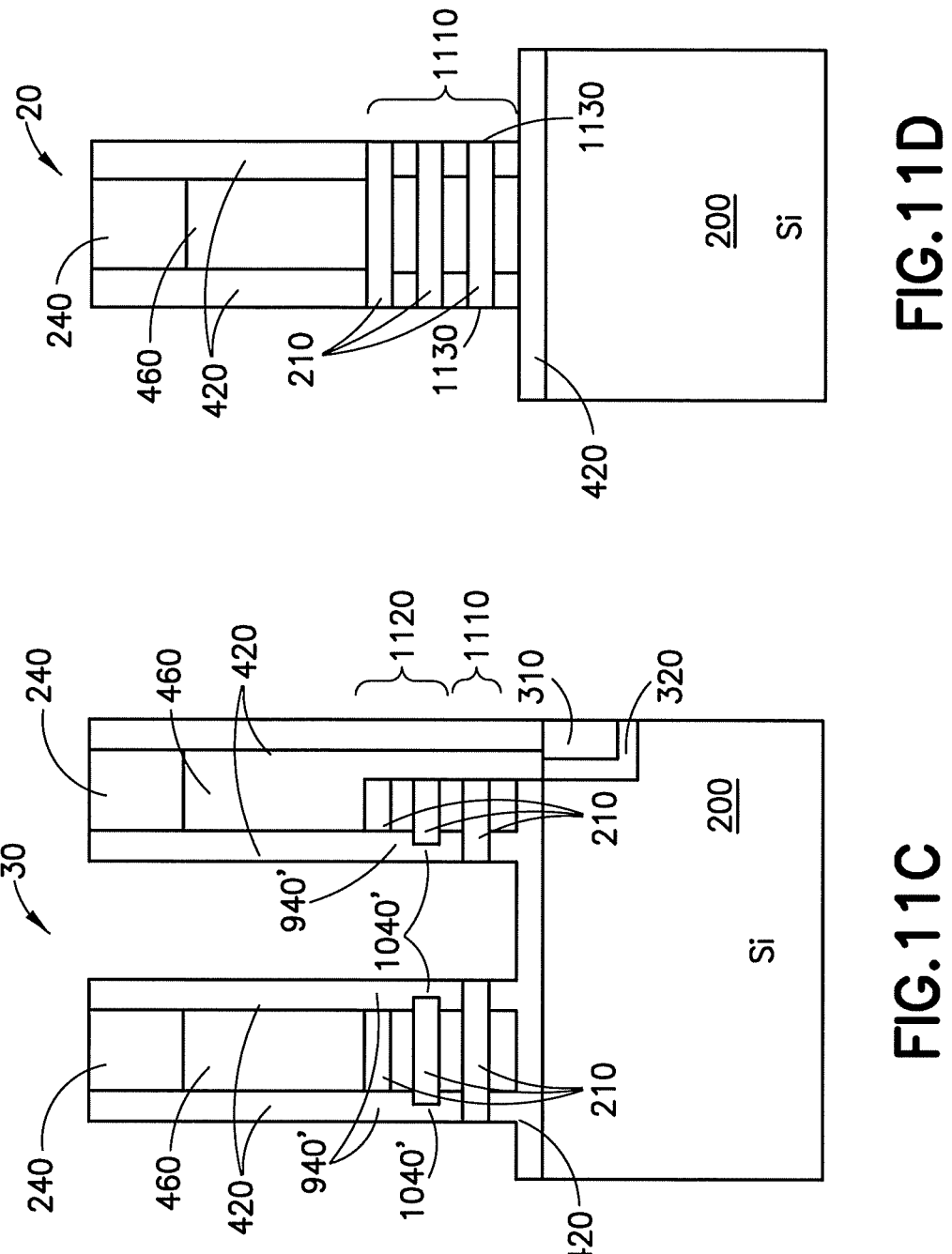

FIG. 11A illustrates a semiconductor layout corresponding to FIGS. 11B, 11C, and 11D. Arrow 1110 indicates a cross-section location for FIG. 11B; arrow 1120 indicates a cross-section location FIG. 11C; and arrow 1130 indicates a cross-section location for FIG. 11D. FIGS. 11B, 11C, and 11D illustrate the integrated circuit structure after a spacer deposition and etch back process, respectively, for a pass gate transistor, a pull up transistor, and a pull down transistor from FIG. 11A. In FIG. 11B, references 940' are used to indicate where the insulating material 420 (as the spacer) has covered the cavities 940. This covering of the cavities 940 by insulator leads to a floating sheet 1120, as the insulator 420 is one impediment to having the material 210 in this layer contact source/drain regions so this sheet does not act as a channel between source/drain regions. Because the "bottom" two layers made of semiconductor material 210 are open at the sides 1130, this will result in two active sheets 1110, as these will contact source/drain regions, thereby yielding sheets that act as a channel. Thus, a pass gate transistor 10 will have one floating sheet 1120 and two active sheets 1110.

For FIG. 11C, a pull up transistor 30 is illustrated and references 940″ are used to indicate where the insulating material 420 has covered the cavities 940. These cavities 940″ were "enlarged" versions of cavities as illustrated in FIG. 10D. Similarly, the references 1040′ are used to indicate where the insulating material 420 has covered the cavities 1040. This covering of the cavities 940 and 1040 by the insulator leads to two floating sheets 1120. Because the bottom layer made of semiconductor material 210 is open at the sides 1130, this will result in an active sheet 1110. Thus, a pull up transistor 30 may have two floating sheets 1120 and one active sheet 1110.

For FIG. 11D, a pull down transistor 200 is illustrated and it is seen that all layers made of semiconductor material 210 are open at the sides 1130. In this example, there are three active sheets 1110.

While the number of active sheets 1110 and floating sheets 1120 have been outlined for the different transistors 10, 20 30, this is only one example. For instance, there could be more or fewer sheets of semiconductor material 210 for a stack 250, and this could change the number of sheets chosen to be active or floating for the transistors 10, 20 30. As another example, each of the transistors 10, 20, and 30 have different numbers of active sheets 1110 (and floating sheets 1120), but it is possible for two of the three to have the same number of active sheets 1110 (and floating sheets 1120).

Figures 12A, 12B:
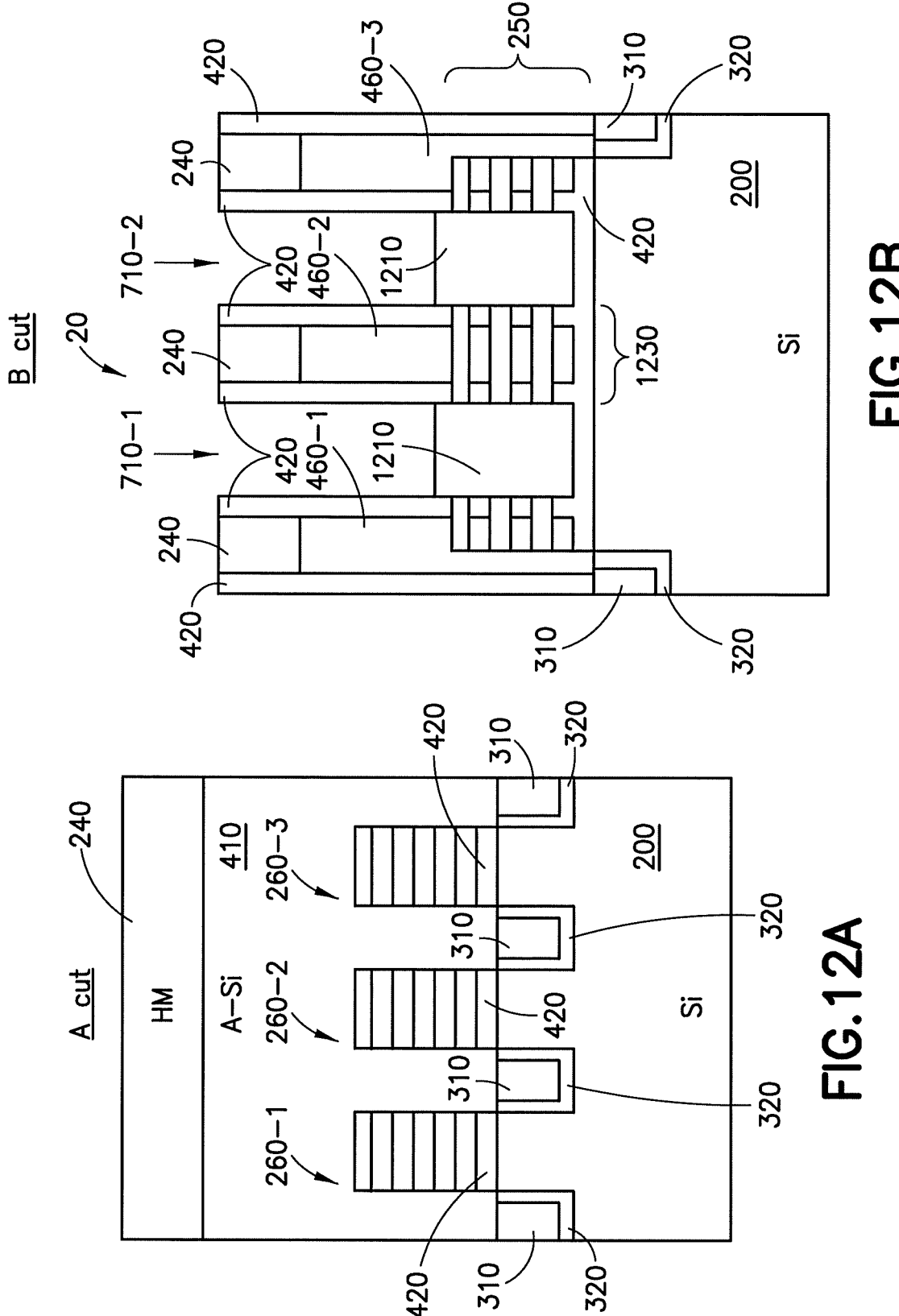
FIGS. 12A, 12B, and 12C illustrate the integrated circuit structure for a pull down transistor after source/drain epi (epitaxial silicon) growth.
Figure 12C:
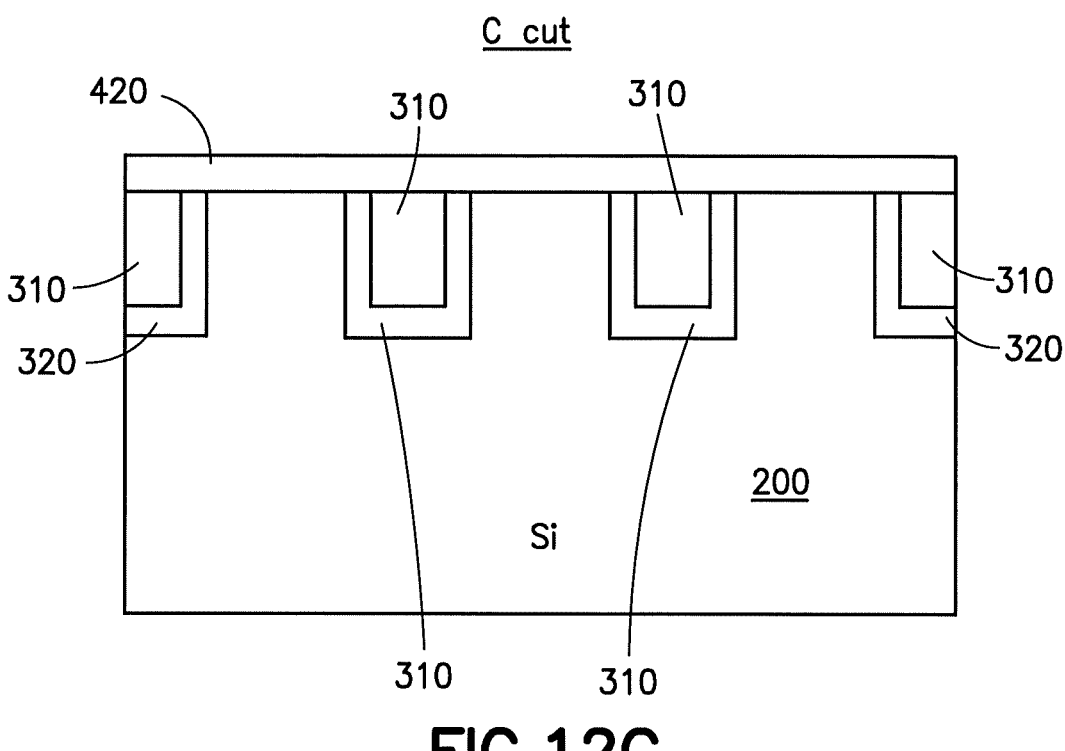
Figure 12D:
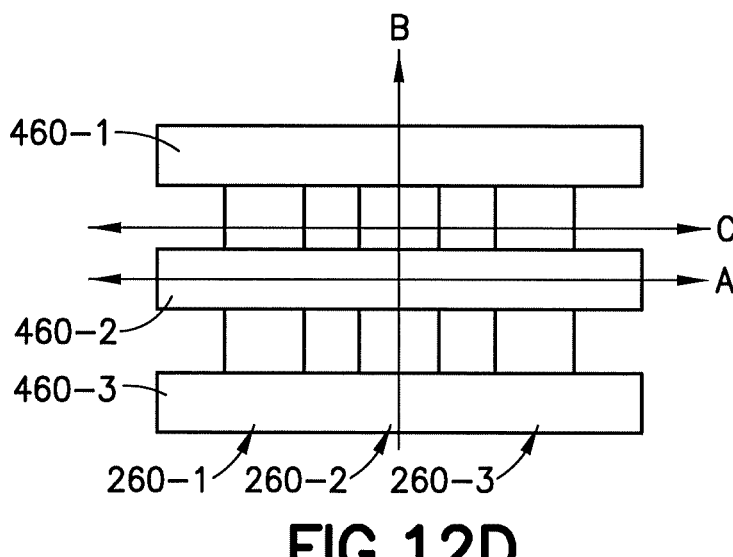
FIG. 12D shows the cuts (A, B, and C, respectively) of the structures being shown in FIGS. 12A, 12B, and 12C.

FIGS. 12A, 12B, and 12C illustrate the integrated circuit structure for a pull down transistor 20 after source/drain epi (epitaxial silicon) growth, and FIG. 12D shows the cuts (A, B, and C, respectively) of the structures being shown in FIGS. 12A, 12B, and 12C. FIGS. 12A, 12B, and 12C are similar to FIGS. 8A, 8B, and 8C, respectively. As can be seen the main difference is in FIG. 12B (relative to FIG. 8B), where the epitaxial layer 1210 has been grown in trenches 710-1 and 710-2. FIG. 12B also illustrates a channel region 1230 that extends laterally between the epitaxial layers 1210, which will be source/drain regions. In this example, the channel region 1230 also has three layers 210 of semiconductor material abutting sides of the epitaxial layers 1210 and electrically coupled (e.g., physically connected) to the epitaxial layers 1210. Note also that the level of the epitaxial layers 1210 is higher than the top surface of the highest one of the layers 210.

Figure 12E:
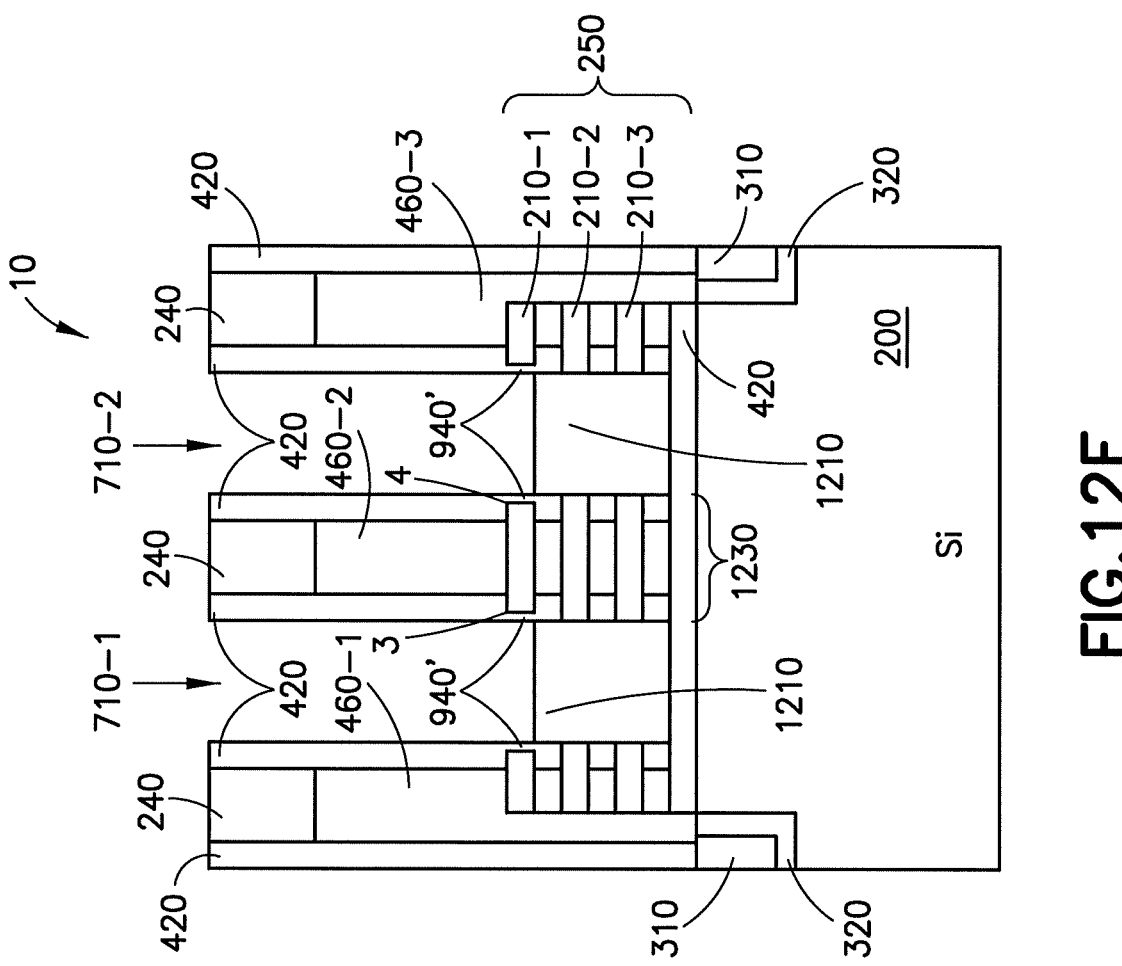
FIGS. 12E and 12F illustrate integrated circuit structures for, respectively, a pass gate transistor and a pull up transistor as alternatives to what is shown for the B cut in FIG. 12B.
Figure 12F:
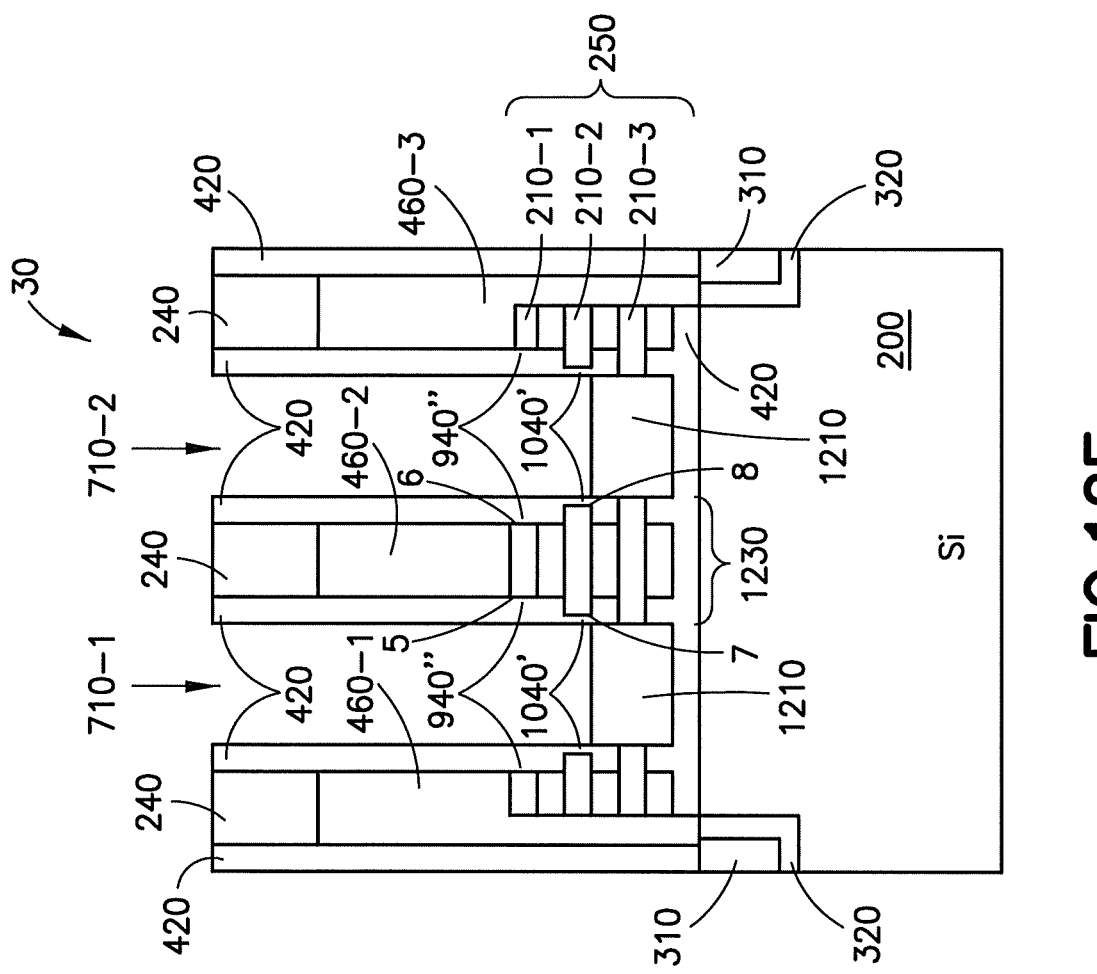

FIGS. 12E and 12F illustrate integrated circuit structures for, respectively, a pass gate transistor and a pull up transistor as alternatives to what is shown for the B cut in FIG. 12B. That is, as shown in FIGS. 11B, 11C, and 11D, there are different configurations of active sheets 1110 and floating sheets 1120 for the transistors 10, 30, and 20, respectively. FIGS. 12B (and 11D) shows pull down transistor 20, and FIGS. 12E and 12F show similar structures as in FIG. 12B for the pass gate transistor 20 and pull up transistor 30, respectively.

In FIG. 12E for the pass gate transistor, it is shown that the epitaxial layers 1210 are coupled to the layers 210-2 and 210-3 (both of the first semiconductor material) but not to the layer 210-1 (of the first semiconductor material), because the insulator 420 fills the cavities 940, as indicated by reference 940′. The insulator 420 also contacts and abuts lateral surfaces 3, and 4, thereby electrically isolating them from any material that would abut the insulator. Thus, the layers 210-2 and 210-3 are active sheets 1110, while the layer 210-1 is a floating sheet 1120, as the layer 210-1 is not connected to (e.g., is electrically isolated from) the epitaxial layer 1210 via the sidewall layer made of insulator 420. FIG. 12E also illustrates a channel region 1230 that extends laterally between the epitaxial layers 1210, which will be source/drain regions. In this example, the channel region 1230 also has two layers 210 of semiconductor material abutting sides of the epitaxial layers 1210 and electrically coupled (e.g., physically connected) to the epitaxial layers 1210, and one layer 210 electrically isolated (via sidewall insulator 420) from the epitaxial layers 1210. Note also that the level of the epitaxial layers 1210 is higher than the top surface of the second one of the layers 210 and is below the bottom surface of the third and highest layer 210. While this is not required, it can be useful and may be an artifact of the process flow.

In FIG. 12F for the pull up transistor, it is shown that the epitaxial layers 1210 are coupled to the layer 210-3 (of the first semiconductor material) but not to the layers 210-1 and 210-2 (of the first semiconductor material), because the insulator 420 fills the cavities 940, as indicated by reference 940′ and fills the cavities 1040, as indicated by the reference 1040′. The insulator 420 also contacts and abuts lateral surfaces 5, 6, 7, and 8, thereby electrically isolating them from any material that would abut the insulator. Thus, the layer 210-3 is an active sheet 1110, while the layers 210-1 and 210-2 are floating sheets 1120, as the layers 210-1 and 210-2 are not connected to the epitaxial layer 1210.

It is noted that the levels of epitaxial layer 1210 are shown as being different heights in FIGS. 12B, 12E, and 12F. As the epitaxial layer grows from a Si surface only, it is inevitable to get lower epitaxial layer height with insulted sheets. FIG. 12F also illustrates a channel region 1230 that extends laterally between the epitaxial layers 1210, which will be source/drain regions. In this example, the channel region 1230 also has one layer 210 of semiconductor material abutting sides of the epitaxial layers 1210 and electrically coupled (e.g., physically connected) to the epitaxial layers 1210, and two layers 210 electrically isolated (via sidewall insulator 420) from the epitaxial layers 1210. Note also that the level of the epitaxial layers 1210 is higher than the top surface of the first one of the layers 210 and is below the bottom surface of the second and third layers 210. While this is not required, it can be useful and may be an artifact of the process flow.

Furthermore, since the trenches 710-1 and 710-2 will be filled with insulator, this may act as another impediment to the layers 210-1 (FIG. 12E) or layers 210-1 and 210-2 (FIG. 12F) contacting the source/drain regions 1210, which means these layers should be floating layers.

In the figures for integrated circuit structures that follow, these are assumed to use the pull down transistor 20 as in FIG. 12B. However, the other transistors 10 or 30 could be used for these figures instead.

Figures 13A, 13B:
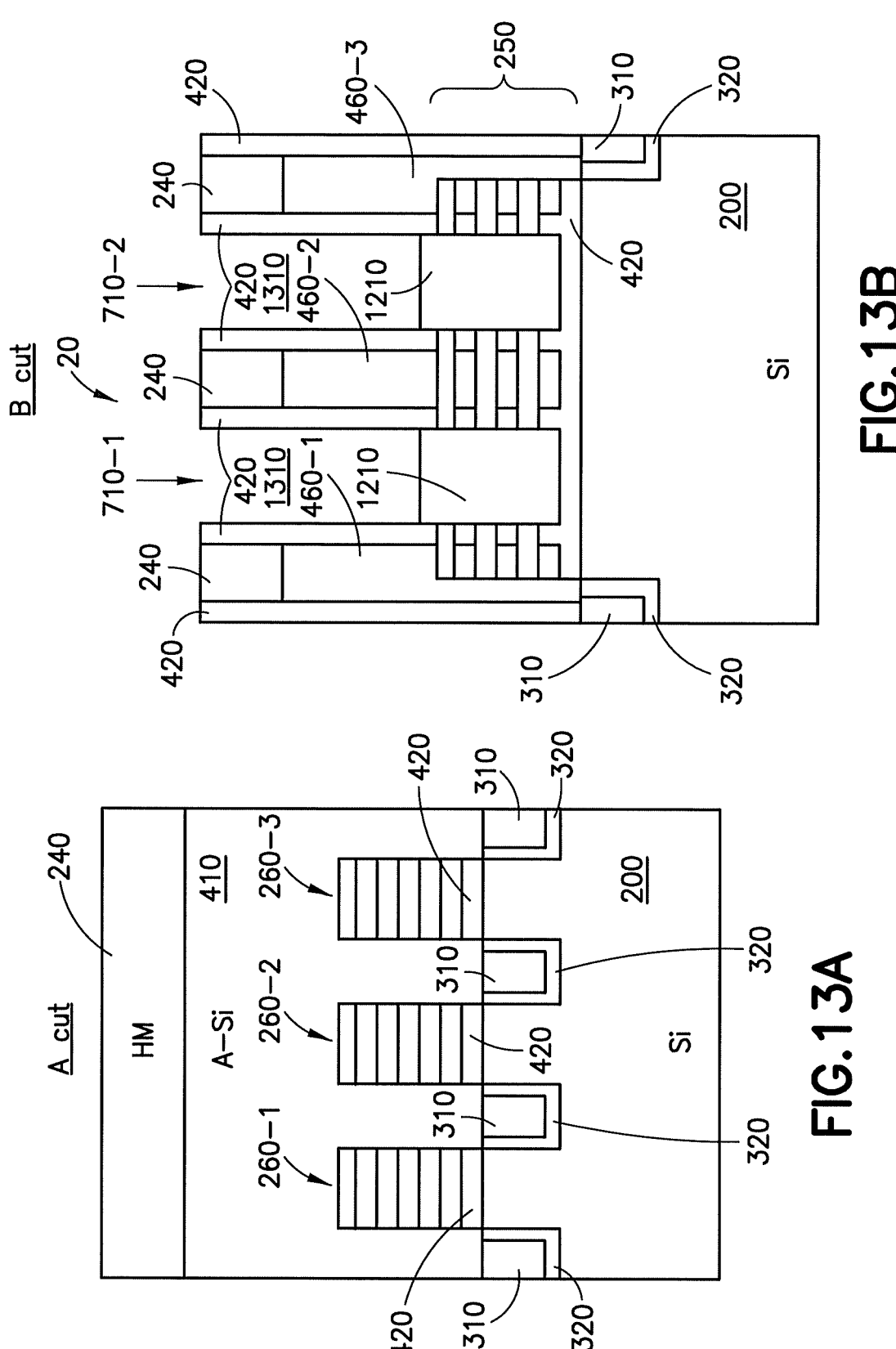
FIGS. 13A, 13B, and 13C illustrate the integrated circuit structure for a pull down transistor after ILD $SiO_2$ deposition and CMP.
Figures 13C, 13D:
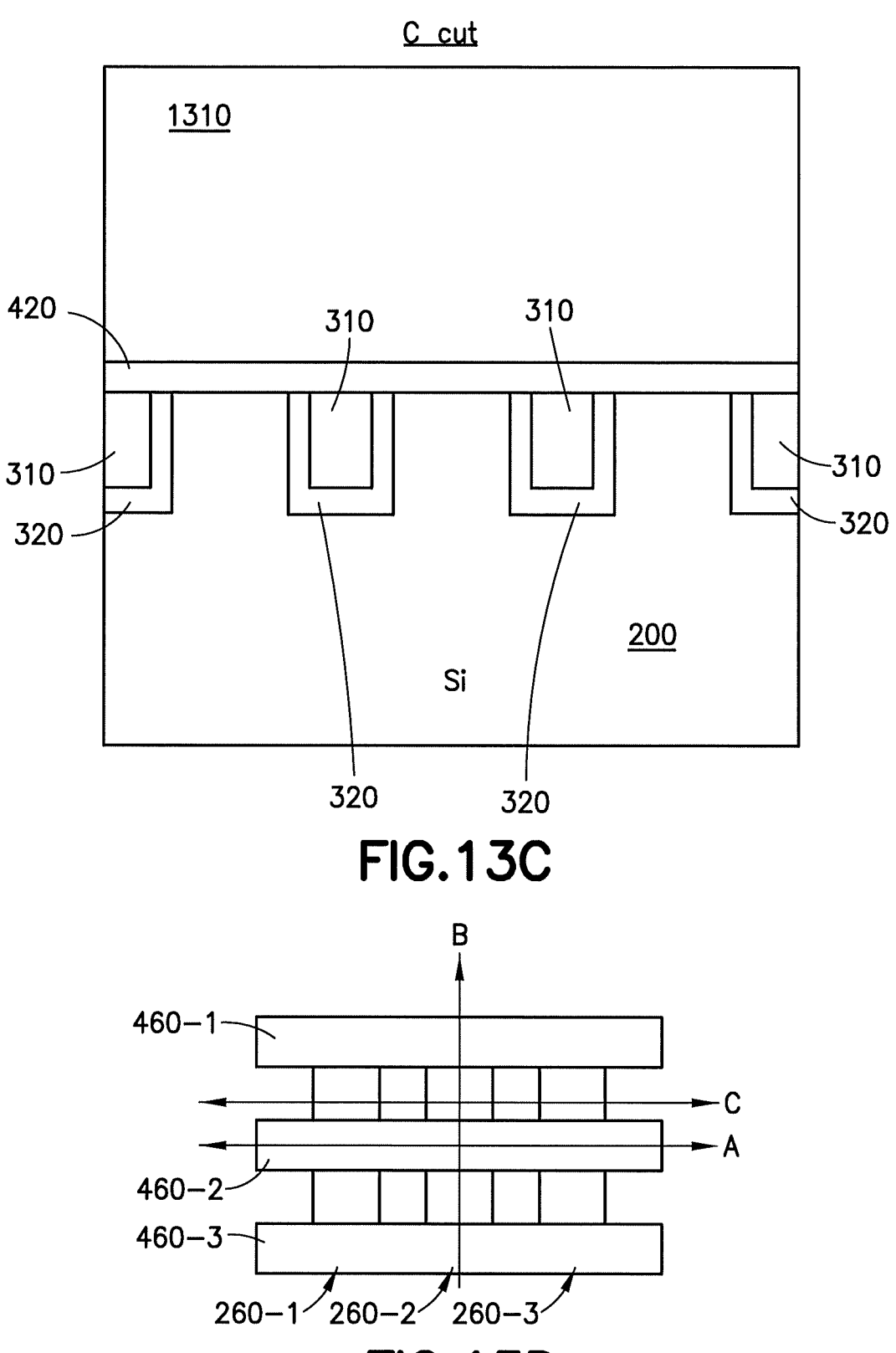
FIG. 13D shows the cuts (A, B, and C, respectively) of the structures being shown in FIGS. 13A, 13B, and 13C.

FIGS. 13A, 13B, and 13C illustrate the integrated circuit structure for a general transistor 20 (e.g., not specific to SRAM) after ILD (interlayer dielectric) $SiO_2$ deposition and CMP (chemical-mechanical polishing), and FIG. 13D shows the cuts (A, B, and C, respectively) of the structures being shown in FIGS. 13A, 13B, and 13C. In FIGS. 13A, 13B, and 13C, an $SiO_2$ deposition (or other insulator) has been performed to form layer 1310, and CMP (or other polishing process) has been performed. The trenches 710-1 and 710-2 have been filled (see FIG. 13B), as has the area in the C cut of FIG. 13C.

Figures 14A, 14B:
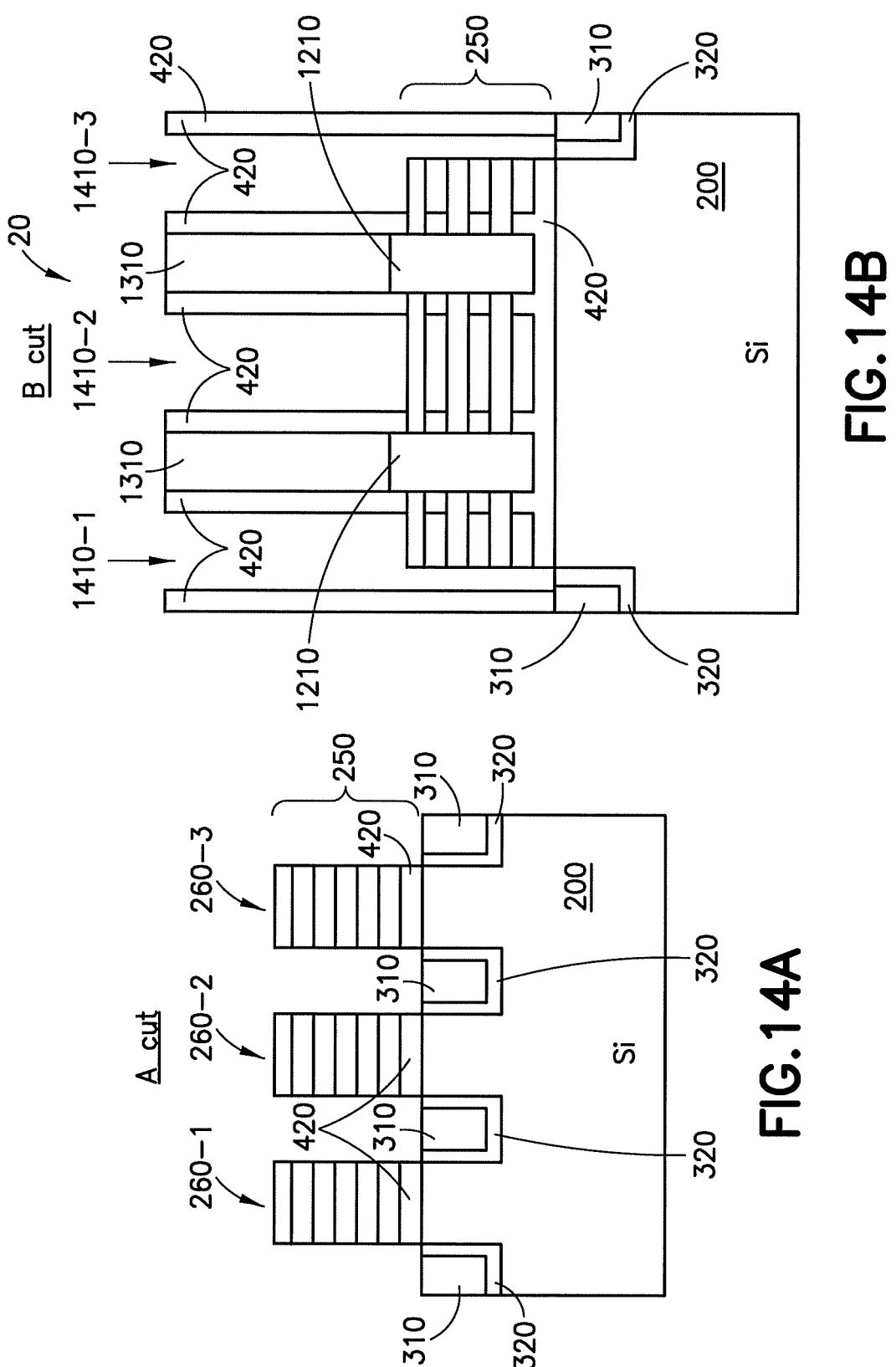
FIGS. 14A, 14B, and 14C illustrate the integrated circuit structure for a pull down transistor after HM (hard mask) open and poly pull.
Figure 14C:
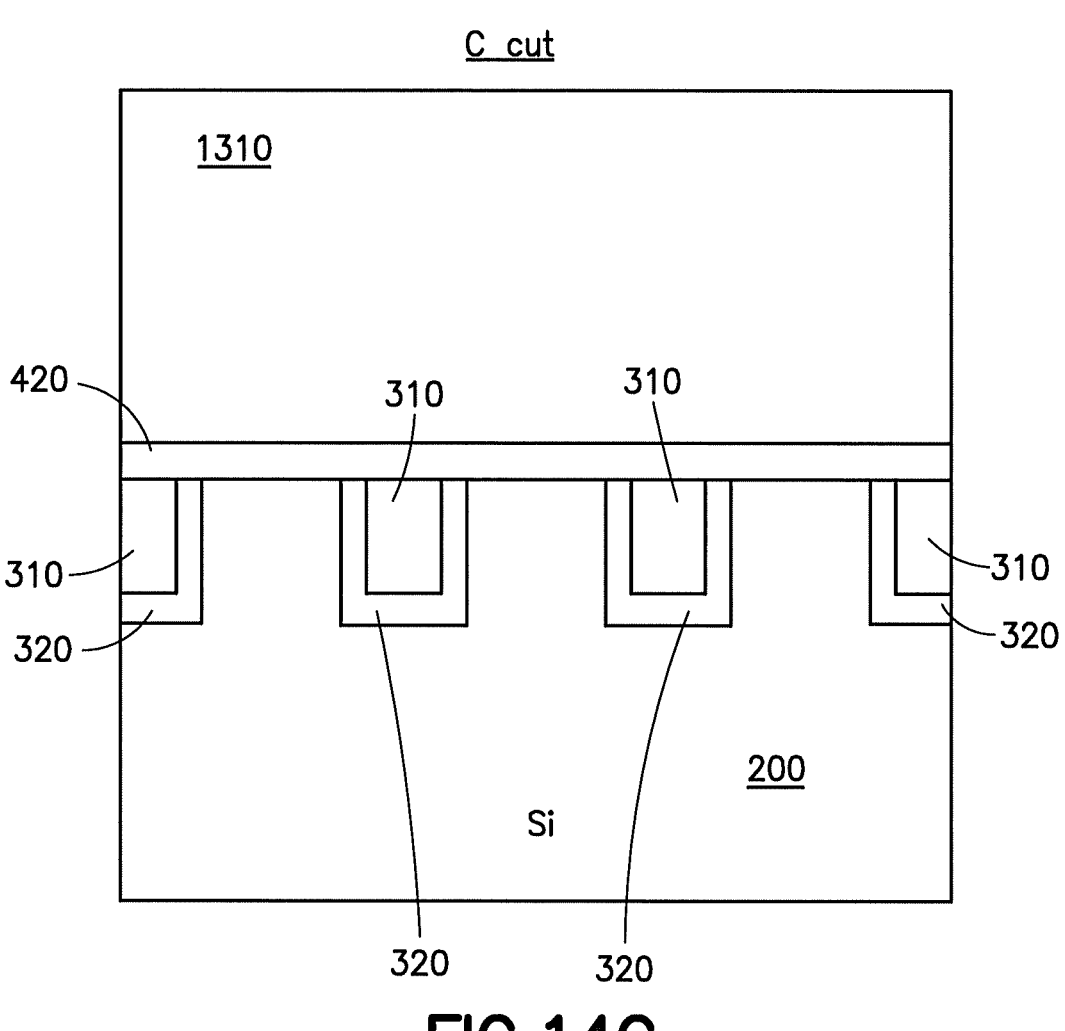
Figure 14D:
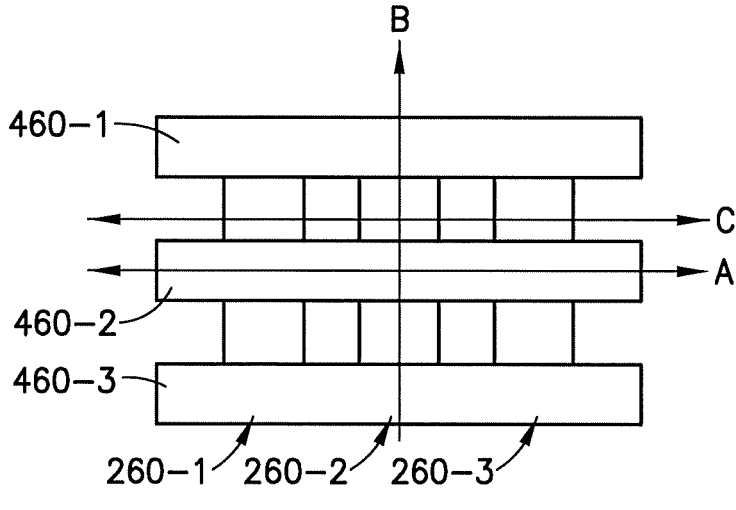
FIG. 14D shows the cuts (A, B, and C, respectively) of the structures being shown in FIGS. 14A, 14B, and 14C.

FIGS. 14A, 14B, and 14C illustrate the integrated circuit structure for a pull down transistor 20 after HM (hard mask)

open and poly pull (which removes dummy A-Si), and FIG. 14D shows the cuts (A, B, and C, respectively) of the structures being shown in FIGS. 14A, 14B, and 14C. The HM 240 has been removed (e.g., via CMP), as has the A-Si 410. In FIG. 14A, this leaves the fins 260-1, 260-2, and 260-3 uncovered. This also causes the trenches (see FIG. 14B) 1410-1, 1410-2, and 1410-3 to be formed. Relative to FIG. 13C, FIG. 14C has no ostensible changes.

Figures 15A, 15B:
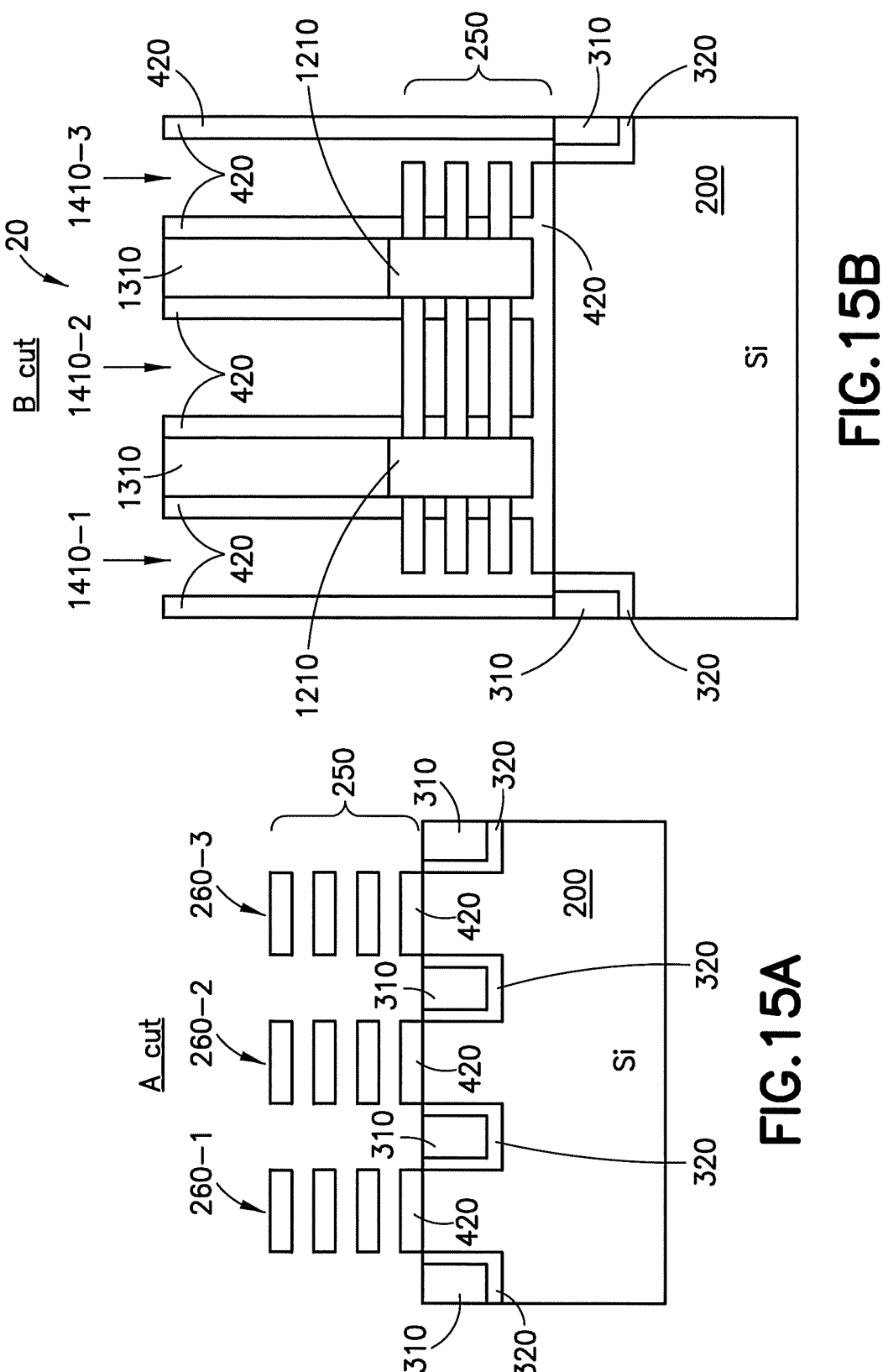
FIGS. 15A, 15B, and 15C illustrate the integrated circuit structure for a pull down transistor after SiGe removal.
Figure 15C:
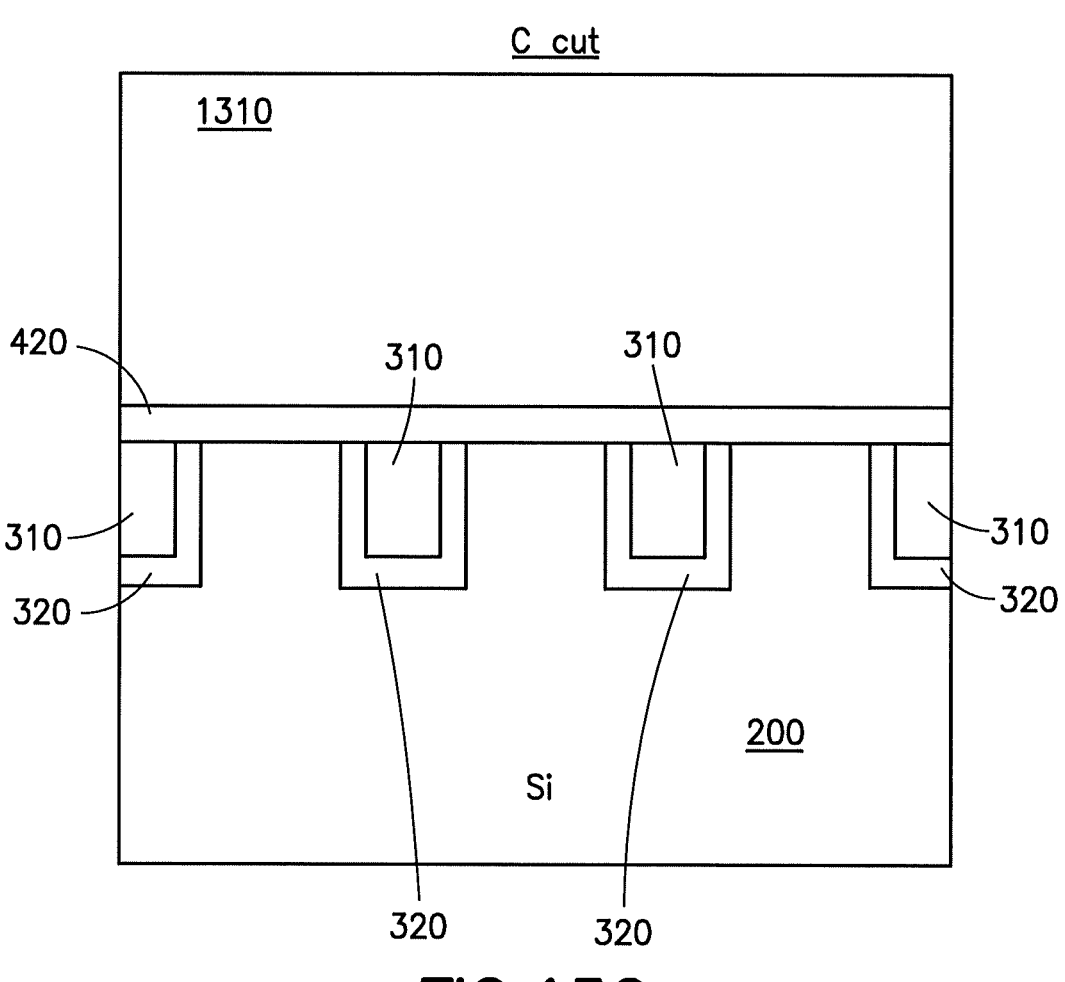
Figure 15D:
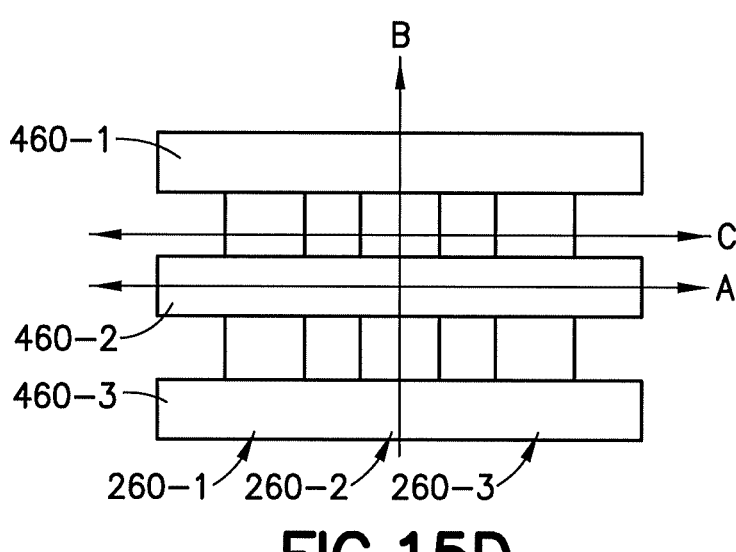
FIG. 15D shows the cuts (A, B, and C, respectively) of the structures being shown in FIGS. 15A, 15B, and 15C.

FIGS. 15A, 15B, and 15C illustrate the integrated circuit structure for a pull down transistor 20 after SiGe removal (which may be performed by isotopic dry or wet etch), and FIG. 15D shows the cuts (A, B, and C, respectively) of the structures being shown in FIGS. 15A, 15B, and 15C. It is seen that the layers 230 made of the second semiconductor material, e.g., SiGe, have all been removed in FIGS. 15A and 15B, though FIG. 15C remains unchanged relative to FIG. 14C.

Figures 16A, 16B:
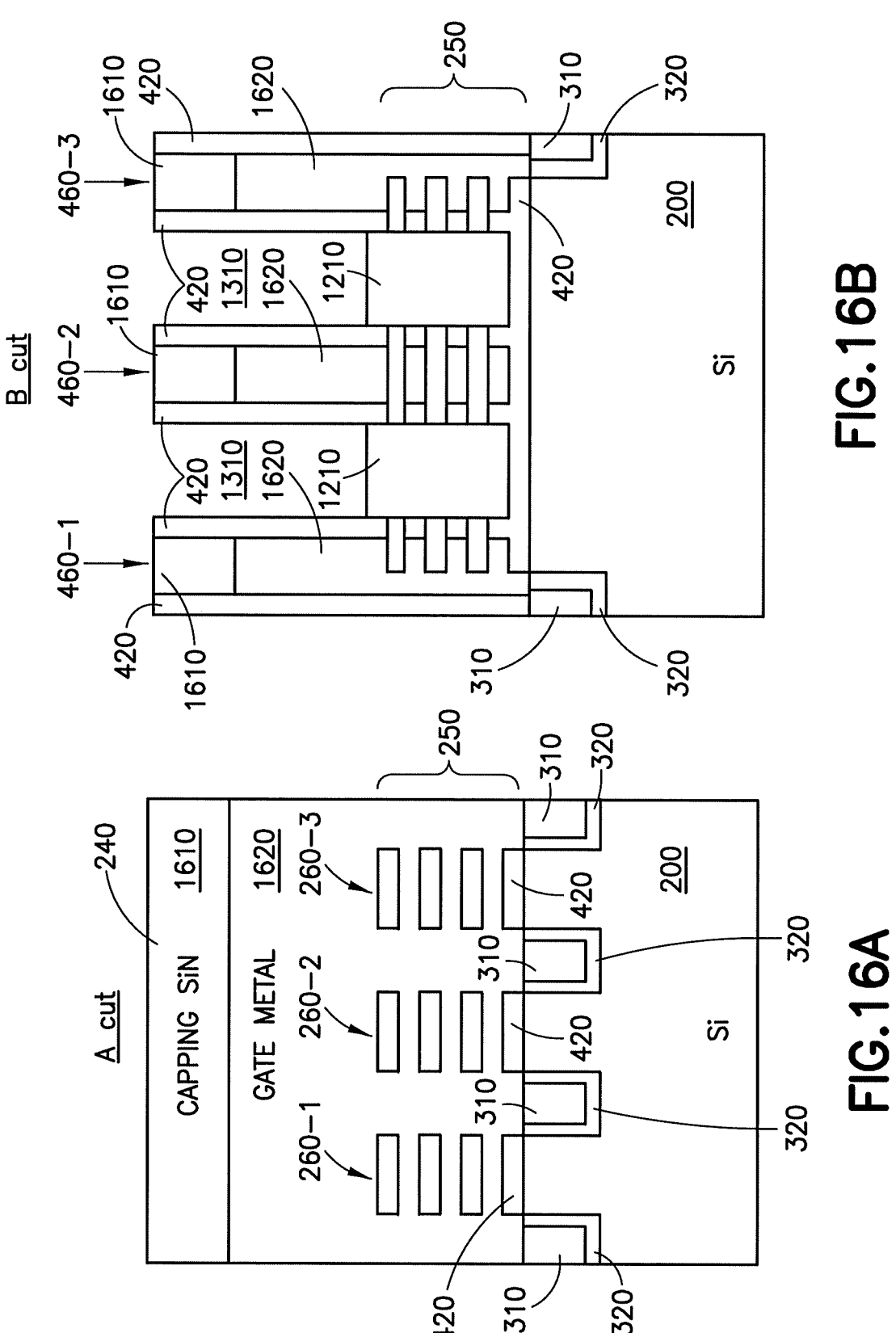
FIGS. 16A, 16B, and 16C illustrate the integrated circuit structure for a pull down transistor after gate metal deposition and capping SiN formation.
Figure 16C:
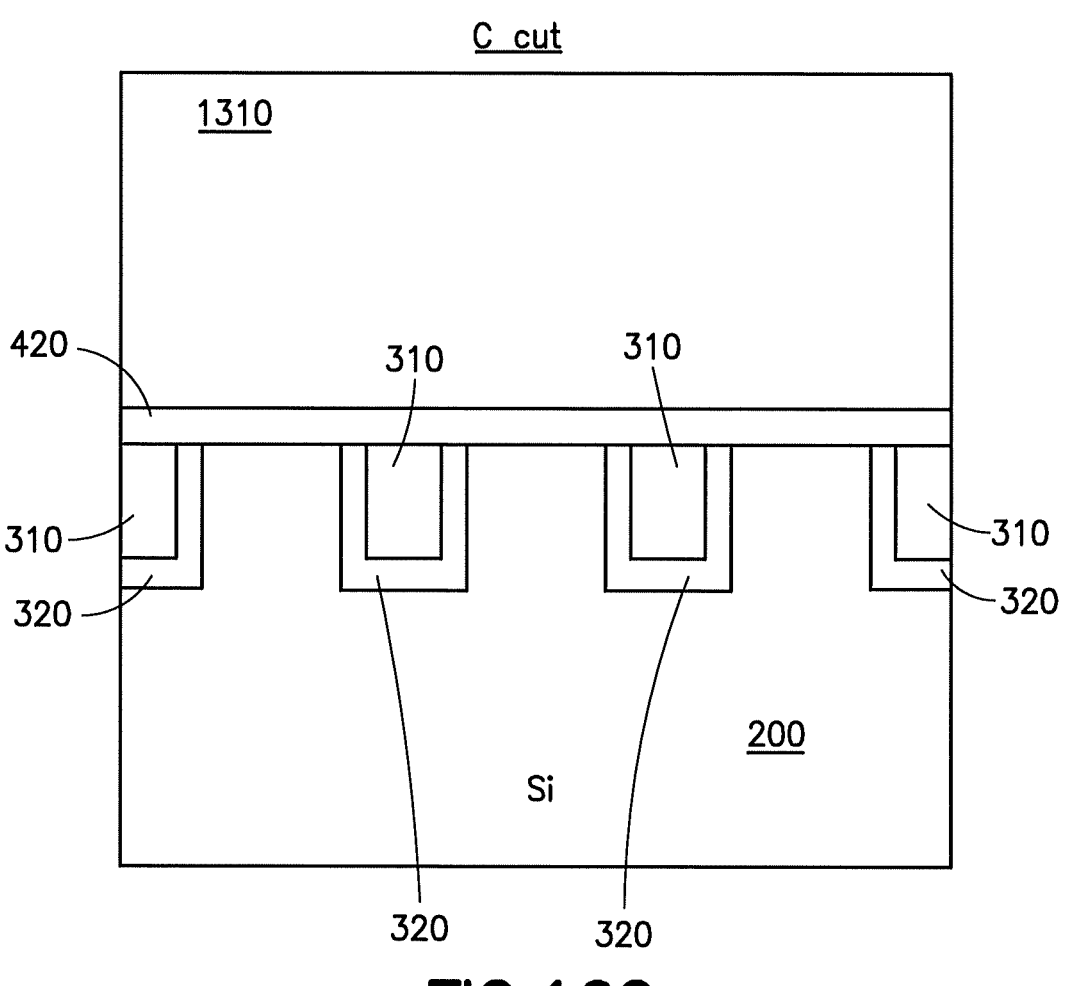
Figure 16D:
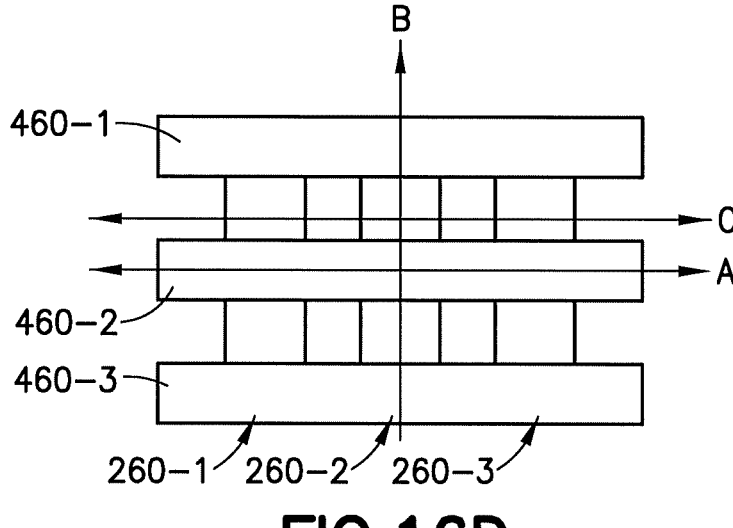
FIG. 16D shows the cuts (A, B, and C, respectively) of the structures being shown in FIGS. 16A, 16B, and 16C.

FIGS. 16A, 16B, and 16C illustrate the integrated circuit structure for a pull down transistor 20 after gate metal deposition and capping SiN formation, and FIG. 16D shows the cuts (A, B, and C, respectively) of the structures being shown in FIGS. 16A, 16B, and 16C. In the A cut of FIG. 16A, the gate metal layer 1620 covers the fins 260 and recesses between the fins, and the capping SiN layer 1610 covers the gate metal layer 1620. The gate metal layer 1620 may be gate oxide or a work function metal as examples, and gate metal can be deposited by conformal deposition, as is known. In FIG. 16B, it can be seen that the capping SiN layer 1610 and gate metal layer 1620 have filled the trenches 1410-1, 1410-2, and 1420-3 of FIG. 15B. FIG. 16C remains unchanged relative to FIG. 15C.

Figures 17A, 17B:
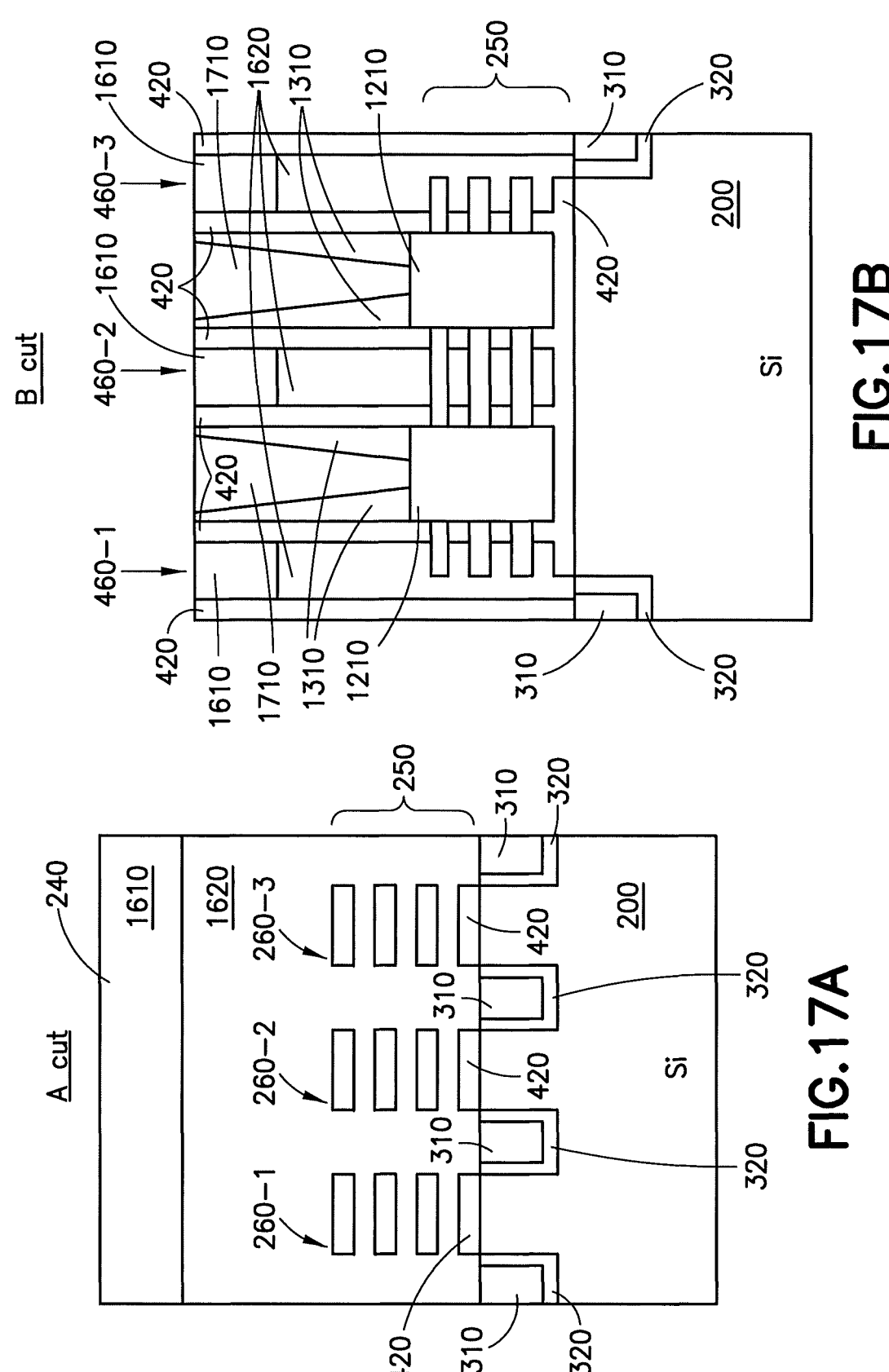
Figures 17C, 17D:
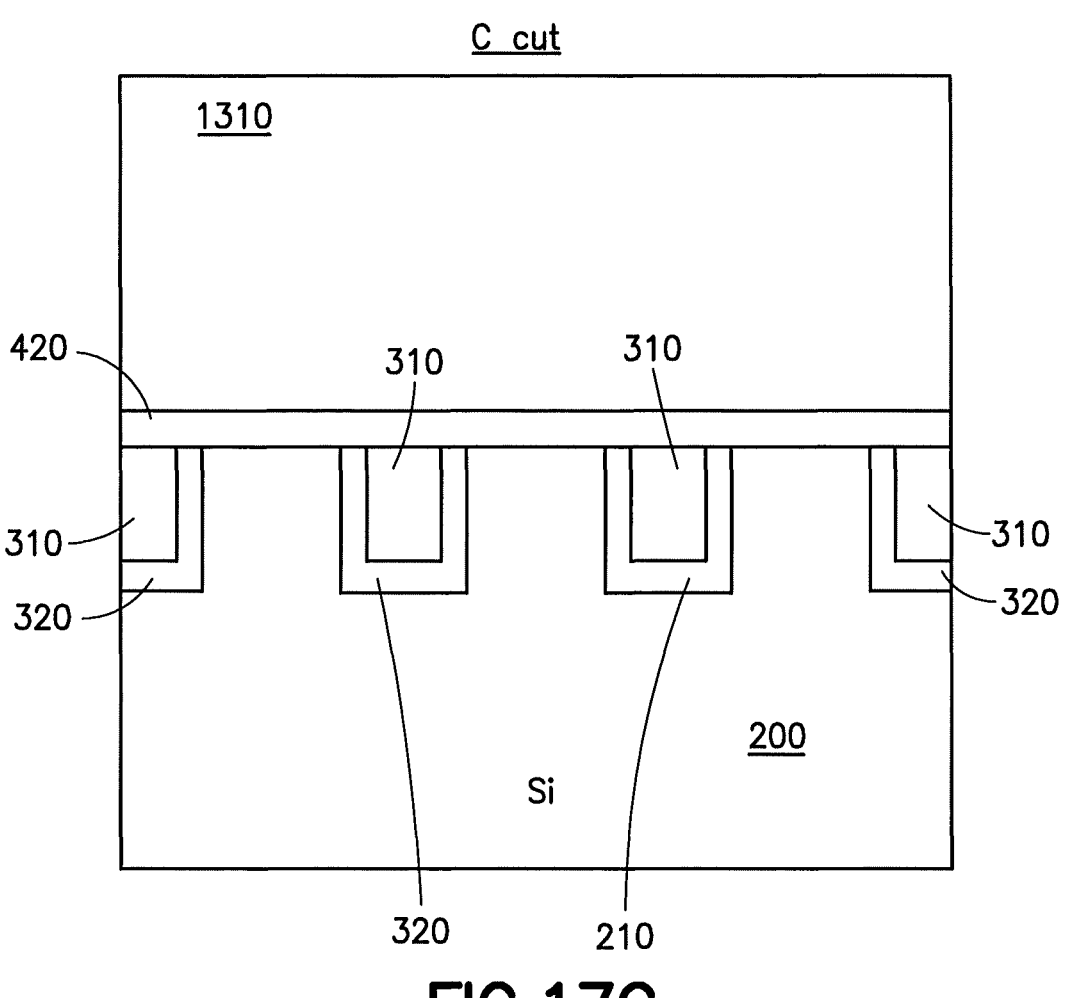

FIGS. 17A, 17B, and 17C illustrate the integrated circuit structure for a pull down transistor 20 after contact formation, and FIG. 17D shows the cuts (A, B, and C, respectively) of the structures being shown in FIGS. 17A, 17B, and 17C. FIGS. 17A and 17C remain unchanged relative to their corresponding respective FIGS. 16A and 16C. FIG. 17B shows contacts 1710 connected, through layers 1310, to the source/drain epitaxial layers 1210.

As stated above, these figures are assumed to use the pull down transistor 20 as in FIGS. 12B, 13B, 14B, 15B, 16B, and 17B. However, the other transistors 10 or 30 (see FIGS. 11B and 11C, respectively) could be used for these figures instead.

Figures 18A, 18B:
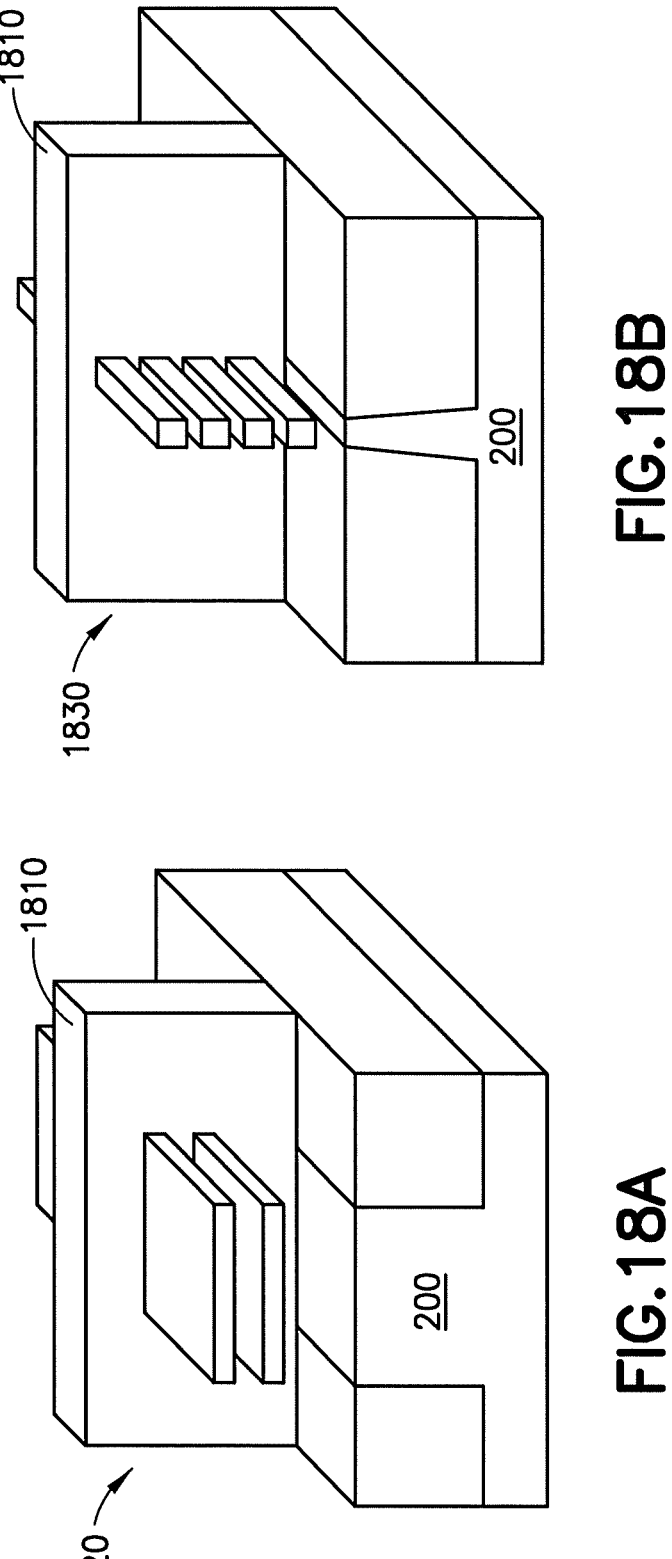
FIG. 18A is a representation of a transistor where layers have been patterned into nanosheets.
FIG. 18B is a representation of transistor where layers have been patterned into nanowires.

Turning to FIGS. 18A and 8B, FIG. 18A is a representation of a transistor where layers have been patterned into nanosheets, and FIG. 18B is a representation of transistor where layers have been patterned into nanowires. The primary emphasis above is on nanosheets, and FIG. 18A shows two nanosheets 1820 of a first semiconductor material 210, which is a conductive semiconductor material forming a channel. A gate 1810 is shown wrapping around all four sides of each of the two sheets 1820, for at least part of the length (i.e., into/out of the sheet) of the nanosheets 1820. While only two nanosheets 1820 are shown, there could be three nanosheets as illustrated in previous figures, or even four or more sheets 1820 could be used. FIG. 17A also shows nanosheets of the first semiconductor material 210 being surrounded by a gate metal layer. This is referred to as "gate-all-around", as four sides of the first semiconductor material 210 will be controlled by the gate 1810 to have a channel.

In FIG. 18B, the layers have been patterned into nanowires 1830. Four nanowires 1830 are shown, though there could be fewer or more than this many nanowires. The instant techniques can be applied to nanowires 1830, through similar processing as above, such that some of the nanowires are active and some of the nanowires are inactive.

In the foregoing description, numerous specific details are set forth, such as particular structures, components, materials, dimensions, processing steps, and techniques, in order to provide a thorough understanding of the exemplary embodiments disclosed herein. However, it will be appreciated by one of ordinary skill of the art that the exemplary embodiments disclosed herein may be practiced without these specific details. Additionally, details of well-known structures or processing steps may have been omitted or may have not been described in order to avoid obscuring the presented embodiments. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. An integrated circuit structure, comprising:
    a memory cell; and multiple transistors forming at least part of the memory cell, the multiple transistors formed using channels comprising a stack, the stack comprising alternating layers of conductive semiconductor material and layers of other material that are insulative, wherein two or more of the multiple transistors have a same number of layers of the conductive semiconductor material in corresponding channel regions but have different numbers of active layers and inactive layers of the conductive semiconductor material, where an active layer is a layer of the conductive semiconductor material forming a channel in the channel region that is electrically coupled to source and drain regions in a corresponding transistor, while a floating layer is a layer of the conductive semiconductor material in the channel region electrically isolated from the source and drain regions in the corresponding transistor.

2. The integrated circuit structure according to claim 1, wherein:

the integrated circuit structure comprises a substrate;

the memory cell is formed on the substrate;

the multiple transistors comprise a first transistor comprising a first source region on the substrate, a first drain region on the substrate, a first channel region extending laterally between the first source region and the first drain region, and a gate wrapping around at least part of the channel region, wherein the first transistor has at least one floating layer formed because the corresponding at least one layer of conductive semiconductor material has an insulator on first and second lateral surfaces of the at least one layer, the insulator electrically isolating the at least one floating layer from material that abuts the isolator.

3. The integrated circuit structure according to claim 2, wherein the multiple transistors comprise:

a second transistor comprising a second source region on the substrate, a second drain region on the substrate, a second channel region extending laterally between the second source region and the second drain region, and a gate wrapping around at least part of the second channel region, wherein all of the sheets of semiconductor material in the second channel region electrically couple to the second source region and second drain region.

4. The integrated circuit structure according to claim 3, wherein:

the at least one floating sheet of the first transistor is a single floating sheet; and the multiple transistors comprise a third transistor comprising a third source region on the substrate, a third drain region on the substrate, a third channel region extending laterally between the third source region and the third drain region, and a gate wrapping around at least part of the third channel region, wherein the third transistor has multiple floating sheets formed because corresponding multiple layers of conductive semiconductor material have an insulator on first and second lateral surfaces of the multiple layers of semiconductor material, the insulator electrically isolating the at least one floating layer from material that abuts the isolator.

5. The integrated circuit structure according to claim 4, wherein the memory cell comprises a static random access memory cell, the first transistor is an N-type pass-gate transistor, the second transistor is a P-type pull up transistor, and the third transistor is an N-type pull down transistor.

6. The integrated circuit structure according to claim 4, wherein inactive sheets in the multiple transistors are farther away from the top surface of the substrate than are active sheets in the multiple transistors.

7. The integrated circuit structure according to claim 6, wherein the third transistor has two floating sheets, wherein the conductive semiconductor material in the two floating sheets of the third transistor have different widths between corresponding first and second lateral surfaces.

8. The integrated circuit structure according to claim 6, wherein source regions and drain regions for the multiple transistors have a top surface far enough away from the top surface to cover the active sheets but not far enough away cover the inactive sheets.

9. The integrated circuit structure according to claim 2, wherein the layers in a corresponding channel region of conductive semiconductor material are parallel to a top surface of the substrate, physically separated by the other material, and stacked vertically away from the top surface of the substrate.

10. The integrated circuit structure according to claim 2, wherein the insulator comprises silicon nitride, SiBCN or SiOCN.

11. The integrated circuit structure according to claim 1, wherein the active and inactive layers are formed from one of nanosheets or nanowires.

12. A method, comprising:

forming a memory cell on a substrate; and forming multiple transistors that form at least part of the memory cell, the forming the multiple transistors comprising:

forming and patterning a stack, the stack comprising alternating layers of conductive semiconductor material and layers of other material that are insulative;

forming channel regions comprising the stack;

forming source and drain regions on opposing sides of the channel regions, wherein two or more of the multiple transistors have a same number of layers of the conductive semiconductor material in corresponding channel regions but have different numbers of active layers and inactive layers of the conductive semiconductor material, where an active layer is a layer of the conductive semiconductor material forming a channel in the channel region that is electrically coupled to source and drain regions in a corresponding transistor, while a floating layer is a layer of the conductive semiconductor material in the channel region electrically isolated from the source and drain regions in the corresponding transistor.

13. The method according to claim 12, wherein:

forming the multiple transistors comprises forming a first transistor comprising a first source region formed on the substrate, a first drain region formed on the substrate, a first channel region extending laterally between the first source region and the first drain region, and forming the first transistor comprises:

forming a gate wrapping around at least part of the channel region; and prior to forming the first source region and first drain region and while forming the first channel region, forming at least one floating layer comprising performing an optical planarization layer coating and lithography to cover sides of fins comprising the stack, performing an optical planarization layer recess to cover active layers but leave the at least one floating layer uncovered by the optical planarization layer, performing a dent of a layer of the semiconductor material in the at least one floating layer, and forming a spacer deposition of insulator to cover sidewalls of the fins including first and second lateral surfaces of the dented layer; and forming the first source region and second source region having sides contacting sides of the fins including sides of the active layers.

14. The method according to claim 13, wherein forming the multiple transistors comprises forming a second transistor comprising a second source region on the substrate, a second drain region on the substrate, a second channel region extending laterally between the second source region and the second drain region, and a gate wrapping around at least part of the second channel region, wherein all of the sheets of semiconductor material in the second channel region electrically couple to the second source region and second drain region.

15. The method according to claim 14, wherein:

the at least one floating sheet of the first transistor is a single floating sheet; and forming the multiple transistors comprises forming a third transistor comprising a third source region on the substrate, a third drain region on the substrate, and a third channel region extending laterally between the third source region and the third drain region, the forming the third transistor comprising:

forming a gate wrapping around at least part of the third channel region; and prior to forming the first source region and third drain region and while forming the third channel region, forming two floating layers comprising performing a first lithographic process comprising an optical planarization layer coating and lithography to cover sides of fins comprising the stack, performing an optical planarization layer recess to cover active layers but leave a first floating layer uncovered by the optical planarization layer, performing a dent of the layer of the semiconductor material in the first floating layer, performing a second lithographic process comprising an optical planarization layer coating and lithography to cover sides of fins comprising the stack, performing an optical planarization layer recess to cover active sheets but leave the first floating layer and a second floating layer uncovered by the optical planarization layer, performing a dent of the layers of the semiconductor material in the first and second floating layers, and forming a spacer deposition of insulator to cover sidewalls of the fins including first and second lateral surfaces the dented sheets; and forming the third source region and third source region having sides contacting sides of the fins including sides of the active layers.

16. The method according to claim 15, wherein a lithography is performed with a mask having open areas for the first transistor and second transistor and having closed areas elsewhere to form the single floating layer of the first transistor and the dent of the first floating layer of the third transistor, and wherein another lithography is performed with a mask having open areas for the second transistor and closed areas elsewhere to form the dent of the first and second floating layers of the third transistor.

17. The method according to claim 15, wherein the memory cell comprises a static random access memory cell, wherein forming the first transistor forms an N-type pass-gate transistor, wherein forming the second transistor forms a P-type pull up transistor, and wherein forming the third transistor forms an N-type pull down transistor.

18. The method according to claim 16, wherein source regions and drain regions for the multiple transistors have a top surface far enough away from the top surface to cover the active sheets but not far enough away cover the floating sheets.

19. The method according to claim 15, wherein the memory cell comprises a static random access memory cell having first, second, and third transistors, wherein forming the first transistor forms an N-type pass-gate transistor having a single floating layer, wherein forming the second transistor forms a P-type pull up transistor having two floating layers, and wherein forming the third transistor forms an N-type pull down transistor with no floating layers and all active layers, and wherein the forming the first, second, and third transistors is performed using lithography with a mask having open areas for the first transistor and second transistor and having closed areas elsewhere to form in part the single floating layer of the first transistor and form in part the first floating layer of the third transistor, and wherein another lithography is performed with a mask having open areas for the second transistor and closed areas elsewhere to form in part the first and second floating layers of the third transistor.

20. The method according to claim 12, wherein the active and inactive layers are formed from one of nanosheets or nanowires.

* * * * *